(12) United States Patent
Osaka et al.

(10) Patent No.: US 6,496,886 B1
(45) Date of Patent: Dec. 17, 2002

(54) DIRECTIONAL COUPLING BUS SYSTEM USING PRINTED BOARD

(75) Inventors: Hideki Osaka, Kanagawa-ken (JP); Toyohiko Komatsu, Yokohama (JP); Masahiro Kitano, Hiratsuka (JP); Akira Yamagiwa, Kanagawa-ken (JP); Ryoichi Kurihara, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/429,441

(22) Filed: Oct. 28, 1999

(30) Foreign Application Priority Data

Oct. 28, 1998 (JP) .......................................... 10-306645

(51) Int. Cl.⁷ ................................................. H01P 5/18
(52) U.S. Cl. ....................................... 710/100; 333/109
(58) Field of Search ................................ 710/100, 305; 333/109, 112, 113, 114, 124

(56) References Cited

U.S. PATENT DOCUMENTS

| | | | |
|---|---|---|---|
| 3,516,065 A | 6/1970 | Bolt et al. | |
| 3,619,504 A | 11/1971 | De Veer | |
| 3,764,941 A | 10/1973 | Nick | |
| 3,786,418 A | 1/1974 | Nick | 375/257 |
| 4,380,080 A | 4/1983 | Rattlingourd | 375/257 |
| 5,119,398 A | 6/1992 | Webber, Jr. | 375/257 |
| 5,229,398 A | 7/1993 | Malen et al. | |
| 5,241,643 A | 8/1993 | Durkin et al. | 365/52 |
| 5,365,205 A | * 11/1994 | Wong | 333/109 |
| 5,376,904 A | * 12/1994 | Wong | 333/109 |
| 5,638,402 A | 6/1997 | Osaka | |
| 5,945,886 A | * 8/1999 | Millar | 174/250 |

FOREIGN PATENT DOCUMENTS

| | | |
|---|---|---|
| JP | 7141079 | 6/1995 |
| JP | 8188366 | 7/1996 |

OTHER PUBLICATIONS

R. Poon, "Computer Circuits Electrical Design", Principal Engineer and Manager of Circuit Engineering, Amdahl Corp., pp. 194–207.
"Limits of Electrical Signaling (Transmitter Equalization)", IEEE HOT interconnect V (Sep. 21–23, 1997), p. 48.
S. Honda, "Present and Future of Technologies for Build–up Type Multilayer Boards", S.C. Laboratory, Inc., Tokyo, Japan, pp. 462–468 (in Japanese only).
P. Allen, et al, "CMOS Analog Circuit Design", Comparator with Hysteresis, pp. 347–357.

* cited by examiner

*Primary Examiner*—Glenn A. Auve
(74) *Attorney, Agent, or Firm*—Antonelli, Terry, Stout & Kraus, LLP

(57) ABSTRACT

In a printed board mounting method using a directional coupling bus for a high-speed data transfer, multi-bit data are transferred between nodes at a low cost. For this purpose, to transfer multi-bit data by directional coupling, a one-bit multi-coupling wiring network is vertically configured in a multilayered printed board. This minimizes the width of an area occupied by each bit along a wiring direction of the board to thereby implement a multi-bit configuration.

21 Claims, 17 Drawing Sheets

MULTIBIT MOUNTING LAYOUT

FIRST EMBODIMENT

PRINTED WIRING BOARD

FIG. 17 : AXIS OF REFLECTION INVERSION

FIG. 7 SECOND EMBODIMENT

FIG. 10
Power / GND Plane
224p — ▮   ▮ — 224n
221p — ▮   ▮ — 221n
Power / GND Plane
FIG. 13
Power / GND Plane
221p   224p   224n   221n
▮      ▮      ▮      ▮
Power / GND Plane

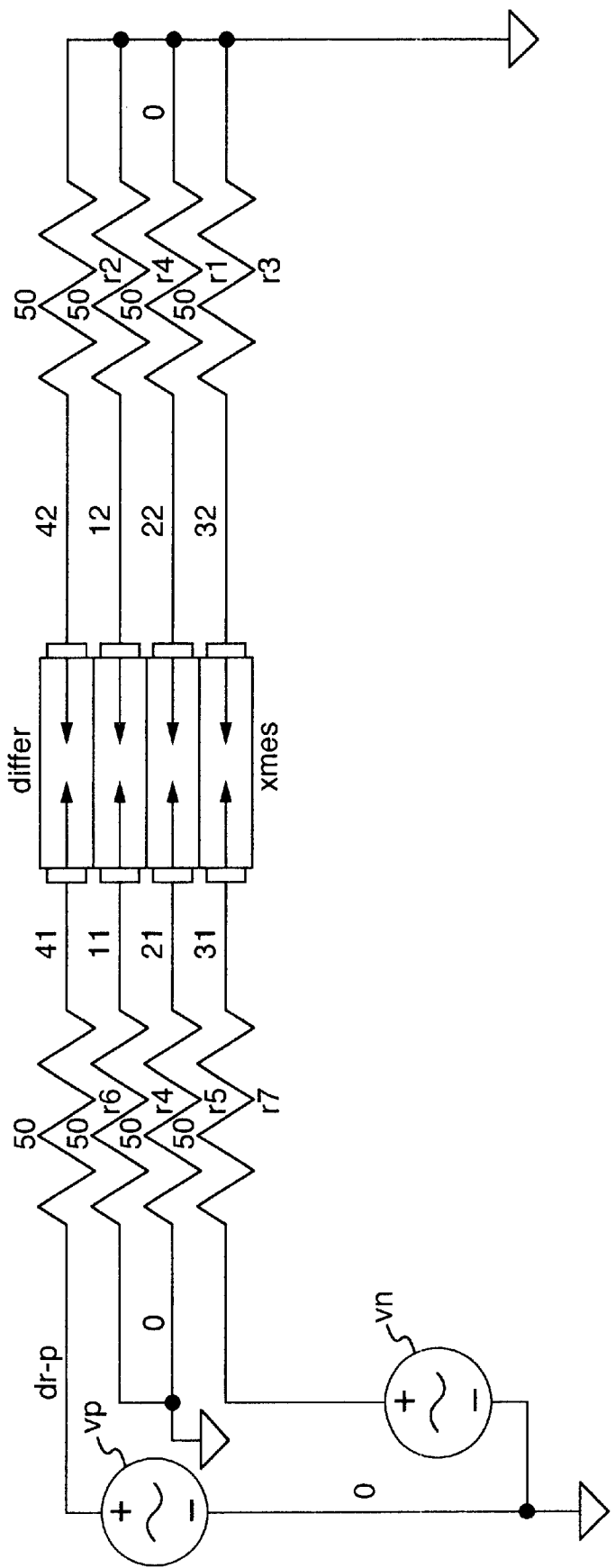

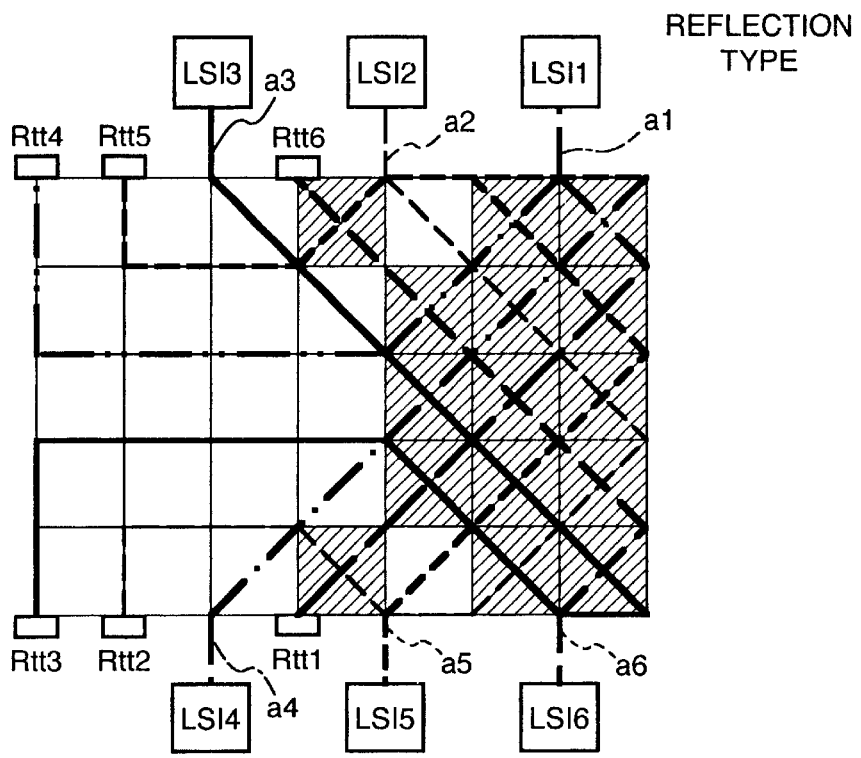
FIG. 17  THIRD EMBODIMENT
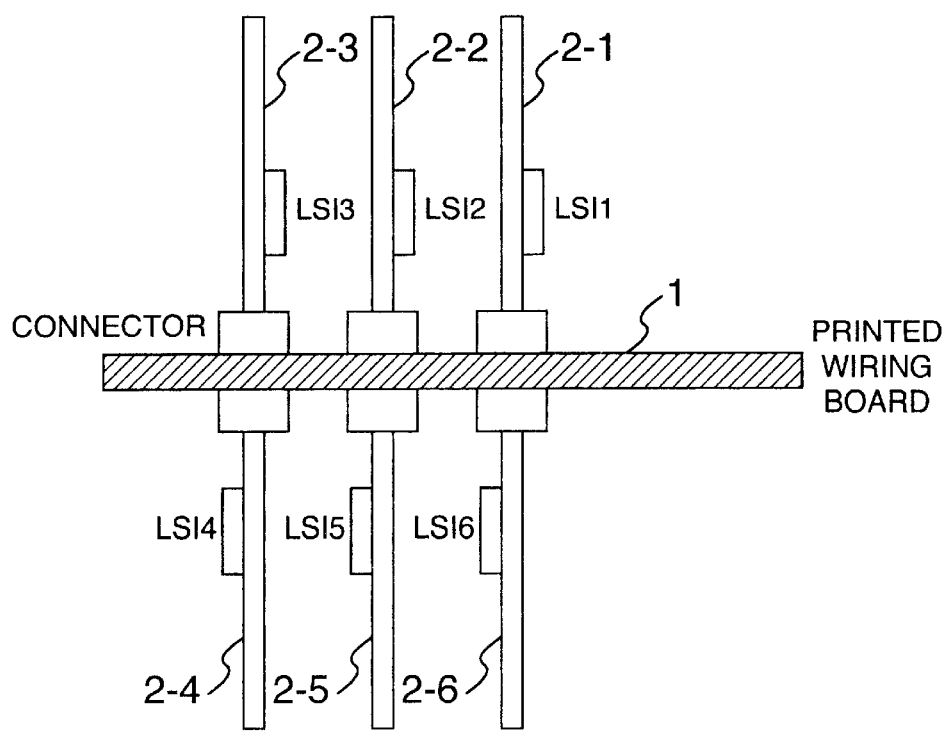
FIG. 18 demodulator states

DIRECTIONAL COUPLING BUS SYSTEM USING PRINTED BOARD

BACKGROUND OF THE INVENTION

The present invention relates to a technology to transfer data between elements of a multiprocessor, a memory, or the like in an information processing system, for example, between digital circuits or functional blocks thereof including complementary metal-oxide semiconductors (CMOS), and in particular, to a technology to increase transmission speed of a data transfer bus in which a plurality of elements are connected to one transmission line.

JP-A-5-2239807 (De Veer et al; U.S. Pat. No. 3,619,504) describes a non-contact bus wiring which is a bus method to transfer data at a high speed between many nodes, for example, in a multiprocessor system. FIG. 3 shows a fundamental layout of the wiring in which data is transferred between two nodes using crosstalk, i.e., a directional coupler. That is, in this transfer technology, data is transferred between a bus master 10-1 and slaves 10-2 to 10-8 by means of crosstalk between two transmission lines, i.e., wiring 1-1 and 1-2 to 1-8. In this diagram, Rtt indicates a termination resistor. This circuit configuration is suitable for data transfer between bus master 10-1 and slaves 10-2 to 10-8, but is not suitable for data transfer between slaves 10-2 to 10-8.

To solve the problem, JP-A-8-188366 (PCT/JP97/03922 filed Oct. 29, 1997) describes a gap coupling bus system. FIG. 4 shows a basic circuit of this system. In the circuit configuration of this technology, data is transferred between nodes 11 to 16 by use of crosstalk signals in directional coupling sections (1–4 to 5–6) in which wiring lines 21 to 26 are coupled with each other as shown in FIG. 4.

"Present State and Problems of Build-Up Multi-Layer Wiring Board Technology" written in pages 463 to 468 of the "Journal of the Society of Circuit Engineers of Japan" describes a technology of printed wiring boards in which via holes of pad-on-via type are implemented at a low cost to increase the wiring density.

In the wiring technology of the gap coupling bus system of JP-A-8-188366, one-bit slave-to-slave transfer routes are arranged in a lattice layout to couple all nodes with each other (in a multi-coupling wiring network). However, this network is not suitable to transfer multi-bit data for the following reasons. To construct a one-bit multi-coupling wiring network, the printed wiring board includes two signal layers arranged in a direction of thickness of the board to form a coupling network in a horizontal direction of the board. This increases the wiring width of each one-bit wiring. That is, to achieve a one-bit transfer using a multi-layered printed wiring board, there are required four layers including two signal layers for each bit and two shield layers. For example, to simultaneously transfer data including one-byte, i.e., eight bits, there are required at least 23 layers including 16 signal layers (two layers×8 bits) and seven shield layers to decrease interference between the bits. Even a personal computer today has a data width of eight bytes. In some server apparatuses, the data width is 16 bytes. To implement such a server using the technology, there are required at least 184 layers (8 bytes×23 layers) for 8-byte data width and 368 layers (16 bytes×23 layers) for 16-byte data width. However, it is difficult to manufacture 100 or more layers at a low cost in the printed wiring board technology at present. Particularly, it is practically impossible to construct a printed wiring board at a low cost using material such as glass epoxy or aramid.

SUMMARY OF THE INVENTION

It is therefore an object of the present invention to provide a data transmission technology in which multi-bit data is transferred between nodes via directional coupling (crosstalk) using a printed wiring board to thereby transfer data at a high speed.

Another object of the present invention to provide a data transmission technology in which differential signals from a directional coupler formed in a printed wiring board are compared with each other such that errors can be detected by demodulating an output signal resultant from the comparison.

To achieve the object in accordance with a concept of the present invention, since multi-bit data is transferred by directional coupling, when a one-bit multi-coupling wiring network is configured, using a multilayered printed wiring board, in a direction vertical to a board surface of the printed wiring board, a multi-bit configuration can be implemented with a minimized width of wiring for one bit in a wiring direction of the board.

The present invention has aspects as follows.

In accordance with a first aspect of the present invention, there is provided a directional coupling bus system including a bus connected to a plurality of modules each including an interface circuit to transfer digital data and a printed wiring board connected to the modules. The system further includes a termination resistor for impedance matching termination of each lead signal line from the modules and directional couplers in lead wiring ranging from a first one of the module to the termination resistor, the couplers including portions of lead wiring respectively from second and subsequent ones of the modules, the portions having a length of, for example, 30 mm. There is also included via holes of non-through type to connect the coupler between the modules to communicate data therebetween.

In accordance with a second aspect of the present invention, in the directional coupling bus system of the first aspect, the directional coupler includes two adjacent lines in one signal layer enclosed between ground planes or layers, and the coupler is connected via the via holes of non-though type.

In accordance with a third aspect of the present invention, in the directional coupler of the system of the first aspect, the digital signals from the modules are differential signals and the signal transmission from a functional element on one side to a functional element on another side is conducted by directional couplers of differential type.

In accordance with a fourth aspect of the present invention, there is provided a printed wiring board. In the bus system of the third aspect, the differential directional coupler includes two signal layers, layers 1 and 2 enclosed with power planes or layers of a printed wiring board. Differential signal (drive signal) lines from the functional element are arranged in layer 1 to be parallel to each other. Differential signal (receive signal) lines to the partner functional element are arranged in layer 2 to be at positions vertically associated with the differential drive signal lines in layer 1.

In accordance with a fourth aspect of the present invention, there is provided a printed wiring board. The directional coupler of differential type in accordance with the third aspect includes one signal layer enclosed with power planes of a printed wiring board. Differential signal (drive signal) lines from the functional element are arranged in the signal layer to be parallel to each other. Differential signal (receive signal) lines to the partner functional element are arranged in another layer of the signal layer to be on both sides of the differential drive signal lines.

In accordance with a sixth aspect of the present invention, there is provided a printed board by using the printed wiring board of the fourth or fifth aspect in which n functional elements (n is equal to or more than two) are mounted on the board. There are arranged m signal layers, each of the layer includes two layers in pair or one layer to configure a directional coupler of differential type. Pairs of signal and ground planes are disposed on the board to set m=n−1.

There are further arranged P directional couplers to transfer data between the n modules, where P=n·(n−1)/2. The P directional couplers are alternately disposed in a direction of thickness of the board such that wiring from the modules configure one set of the P directional couplers for each other module.

In accordance with a seventh aspect of the present invention, in the directional coupling bus system of the first aspect, a receiver includes a differential comparator having hysteresis.

In accordance with an eighth aspect of the present invention, in the directional coupling bus system of the seventh aspect, there is provided a directional coupling bus system of source clock synchronous type in which a receiver receiving data and a clock signal includes a differential comparator having hysteresis and the data is latched by a signal obtained by shifting the clock signal 90° in phase.

In accordance with a ninth aspect of the present invention, in the directional coupling bus system of the first aspect, the receiver includes two differential comparators each having a voltage offset in which one of the receivers has a positive offset and the other one has a negative offset.

In accordance with a tenth aspect of the present invention, in the directional coupling bus system of the ninth aspect, a receiver of data and a clock signal includes a differential comparator having hysteresis and the data is latched by a signal obtained by shifting the clock signal 90° in phase.

In accordance with an 11th aspect of the present invention, for the directional coupling bus system of the tenth aspect, there is provided an error detection circuit in which a differential signal of data signals from the receiver is latched by a differential signal of clock signals of the receiver. A positive logic (H) signal and a negative logic (L) are represented as an up signal and a down signal, respectively. Using the up and down signals, the directional coupling bus system changes its state as up signal input changes from a logical low level (L) to a logical high level (H) that is, "L" to "Ht" up signal input change from "H" level to "Error" state down signal input changes from "L" to "Error"up signal input changes from "H" to "L". Data or an error signal is produced in accordance with the state transition.

In accordance with the 12th aspect of the present invention, the directional coupling bus system of the 11th aspect includes an error detection circuit.

In accordance with the 13th aspect of the present invention, by using the printed board of the sixth aspect of the present invention, there is provided a bus system including a printed wiring board in which the wiring density is increased by consecutively arranging the P directional couplers.

Other objects, features and advantages of the present invention will become apparent from the following description of the embodiments of the invention taken in conjunction with the accompanying drawings.

BRIEF DESCRIPTION OF THE DRAWINGS

FIG. 10 is a cross-sectional view showing a cross section 1 of the differential directional coupler;

FIG. 13 is a cross-sectional view showing a cross section 2 of the differential directional coupler;

FIG. 14 is a diagram showing a simulation circuit to generate signals by a differential directional coupler;

FIG. 17 is a diagram showing bus connection of a multi-coupling network in a board including high-density directional couplers arranged in a vertical direction of the board;

FIG. 18 is a diagram showing constitution of a bus of center plane type;

DESCRIPTION OF THE EMBODIMENTS

Description will now be given of embodiments of the present invention by referring to the accompanying drawings.

Embodiment 1

Figure 1A:
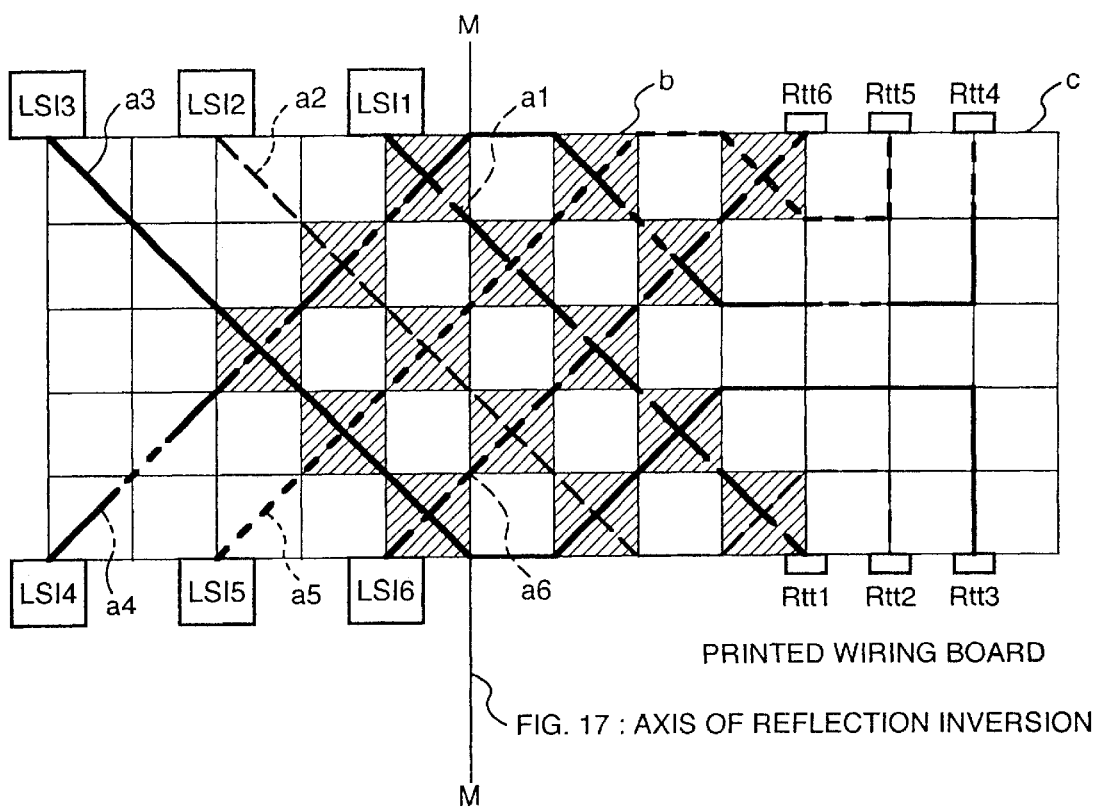
FIG. 1A is a diagram showing bus connection of a multi-coupling network including directional couplers of a first embodiment of the present invention in a vertical direction of a board.
Figure 1B:
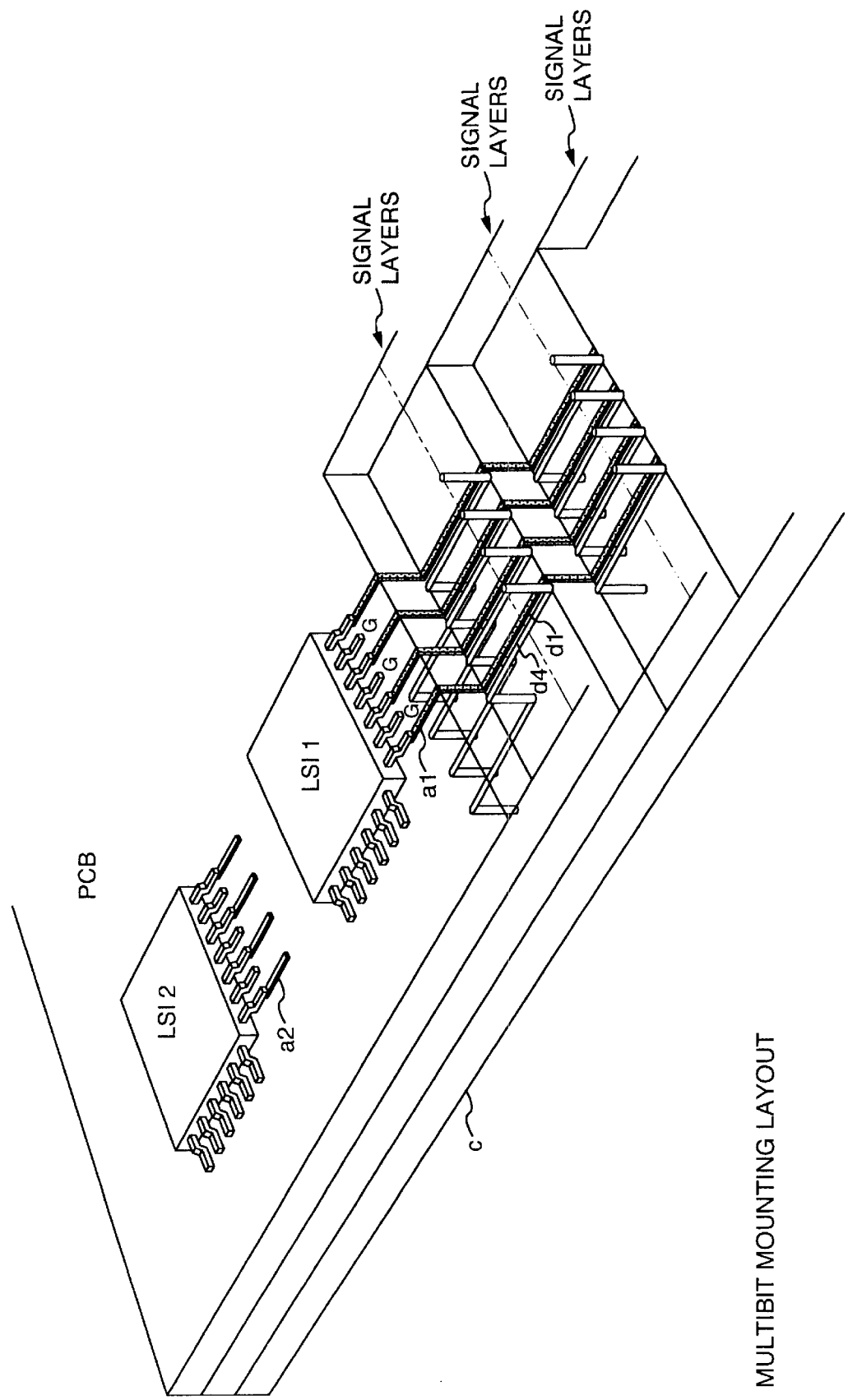
FIG. 1B is a perspective view illustratively showing multi-bit bus connection in the network of FIG. 1A.
Figure 3:
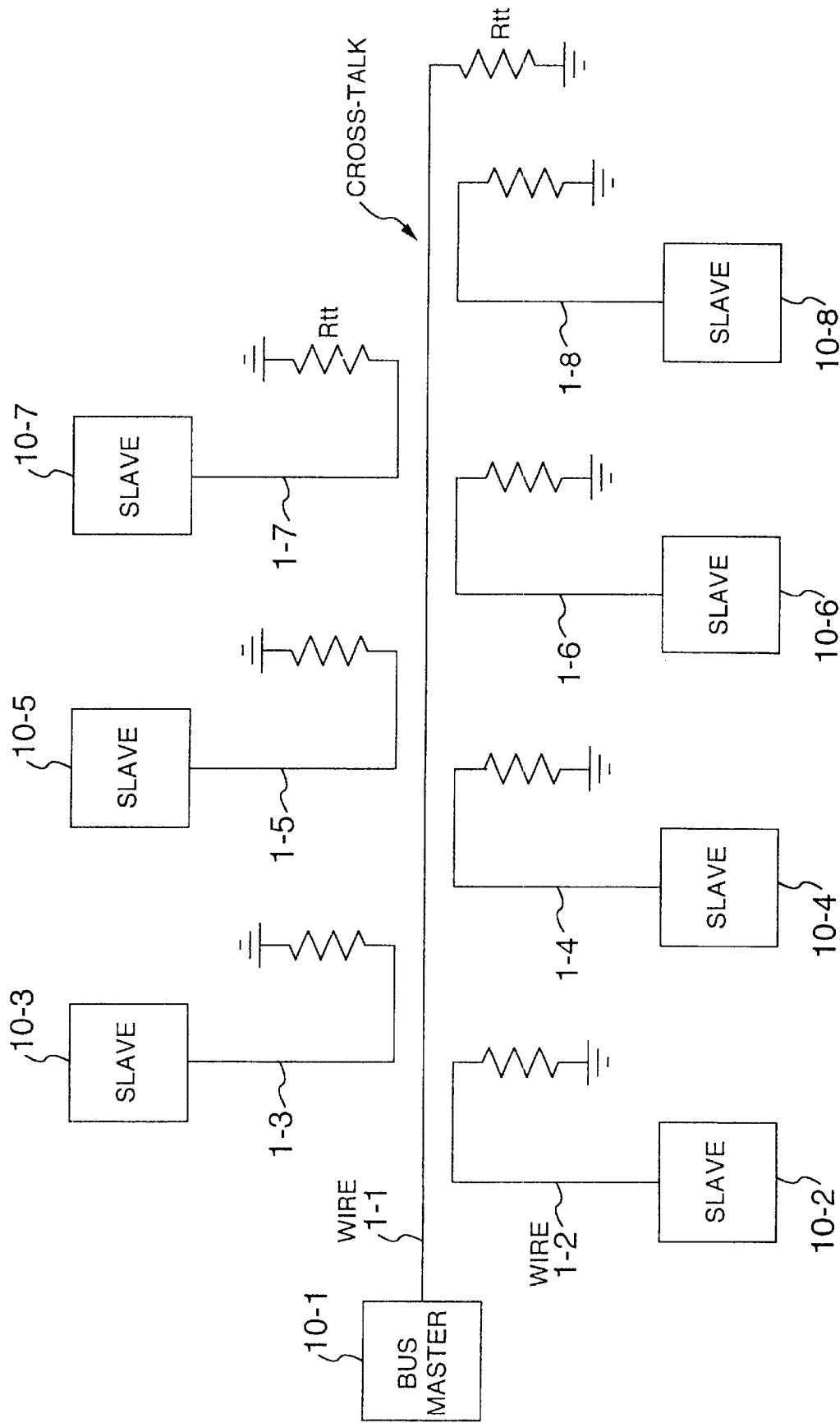
FIG. 3 is a schematic circuit diagram to explain an example of a directional coupler bus of the prior art.

Referring to FIGS. 1A and 1B, description will be given of a first embodiment of the present invention. Using a multilayered printed board, a multi-coupling wiring network is constructed in a vertical-direction, i.e., a direction of thickness of the board. The network includes a bus configuration having a large bus width.

FIGS. 1A and 1B schematically show a cross section of a printed board and a positional relationship of directional couplers.

Blocks of large scale integrated circuits LSI1 to LSI6 indicate large scale integrated circuits to transfer data. Each of LSI1 to LSI6 includes a driver and a receiver for the data transfer.

Inclined lines a1 to a6 schematically indicate flows of wiring drawn from LSI1 to LSI6, respectively. For easy understanding, a1 to a6 are indicated by a broken line, a dot-and-dash line, a real line, a double-dot-and-dash line, a small dot line, and a broken line, respectively. However, these lines are equal in function.

Wiring lines a1 to a6 include at respective ends thereof termination resistors Rtt1 to Rtt6 drawn respectively from LSI1 to LSI6 for matching termination.

A block indicated by thin dotted lines schematically shows an example of a cross-sectional configuration of a printed board. This example includes wiring layers constituting directional couplers and ground planes such that the wiring layers are sandwiched between the ground planes. A block b hatched indicates that this block includes a directional coupler. A block c not hatched indicates that this block includes no directional coupler.

The directional coupler in block b hatched is represented by a cross-point or an intersection of two wiring flows selected from wiring flows a1 to a6. Flow a1 first intersects flow a4 such that a block of the intersection configures a directional coupler. Due to the coupler, there can be produced a signal to transfer data between LSI1 and LSI2. Wiring a1 from LSI1 goes down in the lower-right direction of the diagram to intersect wiring a5 from LSI5. This block similarly generates a signal to transfer data between LSI1 and LSI5. In this way, wiring a1 sequentially constructs directional coupling with signals from the respective LSI circuits such that the couplers thus configured generate signals necessary for the respective data transfers.

Particularly, in a coupler block of wiring lines a and a3, wiring a3, having intersected wiring a4, a5, and a6, changes its direction through a block not including a directional coupler and extends in the upper-right direction. In a similar fashion, wiring a1 extends in the lower-right direction to finally terminates at termination resistor Rtt 1.

Wiring lines a1 to a4 extend in the upper-right or upper-left direction and construct directional couplers at each intersection therebetween. Each wiring changes the extending direction at the highest and lowest positions in the diagram and terminates, after having intersected the other wiring lines, at an associated termination resistor (Rtt 1 to Rtt 6). Although the LSI circuits are mounted on both surfaces of the printed board in the example of FIG. 1A, it is to be appreciated that they may be mounted only on one surface of the board. In the bus connection of FIGS. 1A and 1B, while FIG. 1A shows an example of a one-bit line bus, FIG. 1B is an example of a multi-bit bus.

To transfer data between the LSI1 to LSI6, there is required only one set of combinations of the cross-points or intersections between the wiring. Specifically, tow elements are selected from six elements in this situation, namely, 15 combinations exist. FIG. 1A shows all combinations for six LSI circuits, i.e., 15 intersection blocks b.

Even when the number of LSI circuits is other than 15, if the wiring is similarly configured to dispose intersection blocks b for directional couplers associated with wiring lines from the LSI circuits, it is resultantly possible to generate signals for the data transfer between the LSI circuits. In a system including n LSI circuits, the number of required intersections (P) is represented as follows.

$$\text{No. of intersection blocks } (P) = n \cdot (n-1)/2 \ldots \quad (1)$$

Subsequently, the layout of intersection block b will be described by referring to FIGS. 2A and B.

In FIG. 1A, a block to generate a signal to transfer data between LSI1 and LSI4, namely, an intersection block between wiring a1 and wiring a4 will be described as an example.

Figure 2A:
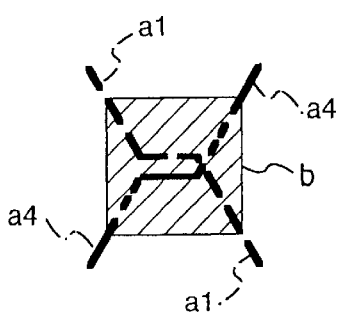
FIGS. 2A and 2B are perspective views showing constitution of the directional coupler.
Figure 2B:
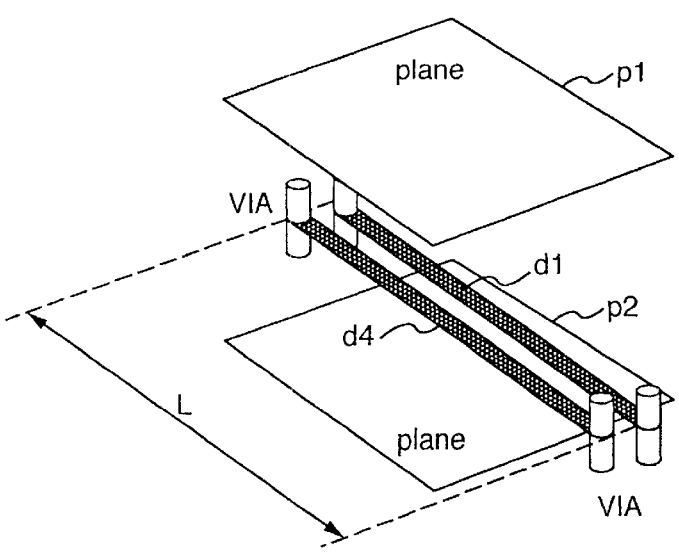

FIG. 2A schematically shows a block in FIG. 1 and FIG. 2B shows in a perspective view a configuration of an actual printed board constituting the block.

Wiring flows a1 and a4 of FIG. 2A correspond to wiring lines d1 and d4 of FIG. 2B. Two wiring lines provide parallel lines to configure a directional coupler having a length of L.

Plane layers for power include plane sections p1 and p2 to enable wiring d1 and d4 to form a strip line. Directional coupling lines d1 and d4 are connected at their ends to other signal layers by via holes indicated by cylindrical symbols.

Figure 5:
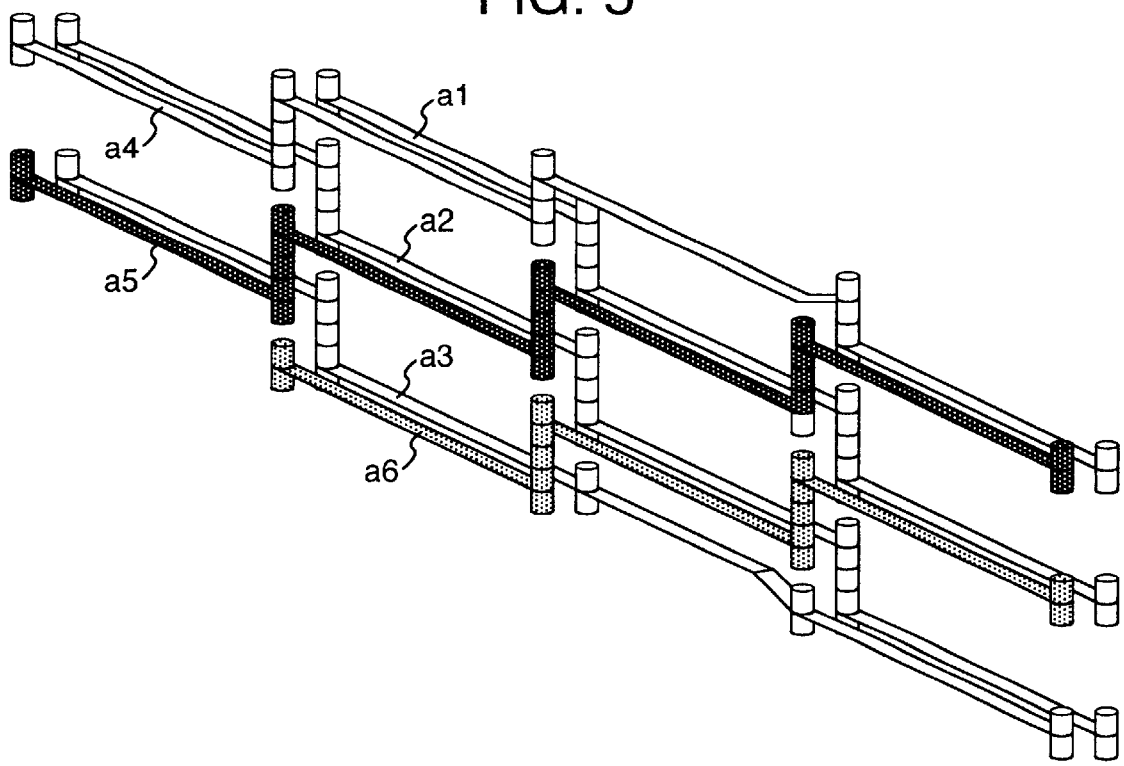
FIG. 5 is a perspective view showing a wiring layout in accordance with the present invention.
Figure 6:
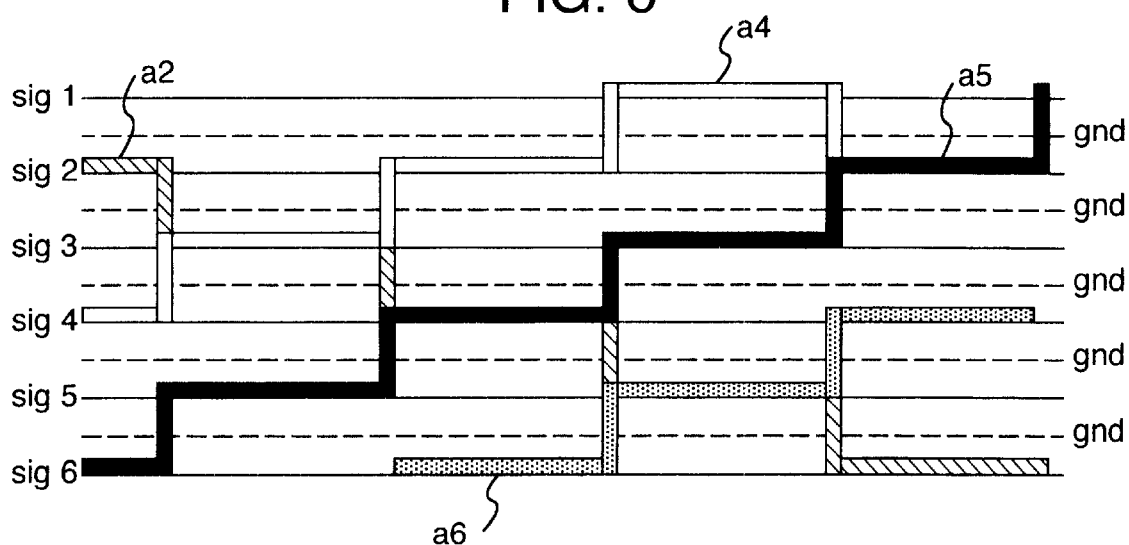
FIG. 6 is a cross-sectional view of the wiring layout of FIG. 5.

FIGS. 5 and 6 show a layout of wiring between the blocks. FIG. 5 shows in a perspective view only connections of wiring, namely, power planes are not shown. FIG. 6 shows a cross section of FIG. 5 which includes only some of the signals. The printed board includes signal layers sig1 to sig6 and five ground layers gnd indicated by dotted lines. The ground layers minimizes interference between the directional couplers in the vertical direction.

The configuration of FIG. 5 partially includes six types of wiring a1 to a6.

Two lines forming the directional coupler are adjacent to each other in one signal layer. In the configuration of FIGS. 5 and 6, wiring a4 to a6 on the front side extends in the upper-right direction and wiring a1 to a3 on the rear side extends in the lower-right direction. In FIG. 6, a signal one line a2 indicated by hatching is connected to a position in the lower-right direction. When the wiring reaches a highest edge, it changes the extending direction. In FIG. 5, for example, wiring a4 at the highest layer is connected to second signal layer sig2. The wiring is shifted from the layer on the front side to the layer on the rear side.

Via holes are used to connect the directional couplers to each other. However, between a wiring line on an upper signal layer and a wiring line on a lower signal layer, signals of only one of the upper and lower layers are connected through the via holes between the directional couplers. Therefore, it is effective to use a pad-on-via type, not a via of through type, for the connection between the wiring line in an upper layer and the wiring line in a lower layer as shown in FIG. 6. Consequently, a printed board produced in a build-up manufacturing method is suitably applied to this configuration. Although not shown in FIG. 5, the planes (indicated as gnd) of FIG. 6 naturally have via holes to connect directional couplers to each other.

As a result, when the bus has a bus width of one bit, data can be transferred via a board including a plurality of directional couplers arranged in a multilayer configuration.

In this embodiment, an area occupied by the differential one-bit signal is almost equal to an area occupied by at most two wiring lines. Consequently, also in a multi-bit bus system, the configuration above can be implemented only by arranging the wiring in a layout similar to that shown in FIG.

5. When compared with the prior art, a larger number of layers can be disposed to arrange the directional couplers therein. Namely, due to the directional couplers in the multilayered configuration, data can be transferred between LSI circuits at a high speed even via a multi-bit bus. Moreover, this can be achieved with the printed board of the prior art. As a result, a high-performance system and a low-priced system can be compatibly used.

Embodiment 2

Description will be given of a second embodiment of the present invention by referring to FIGS. 7 to 16. In the embodiment, the directional coupler b is configured in a differential type in the intersection block.

Figure 4:
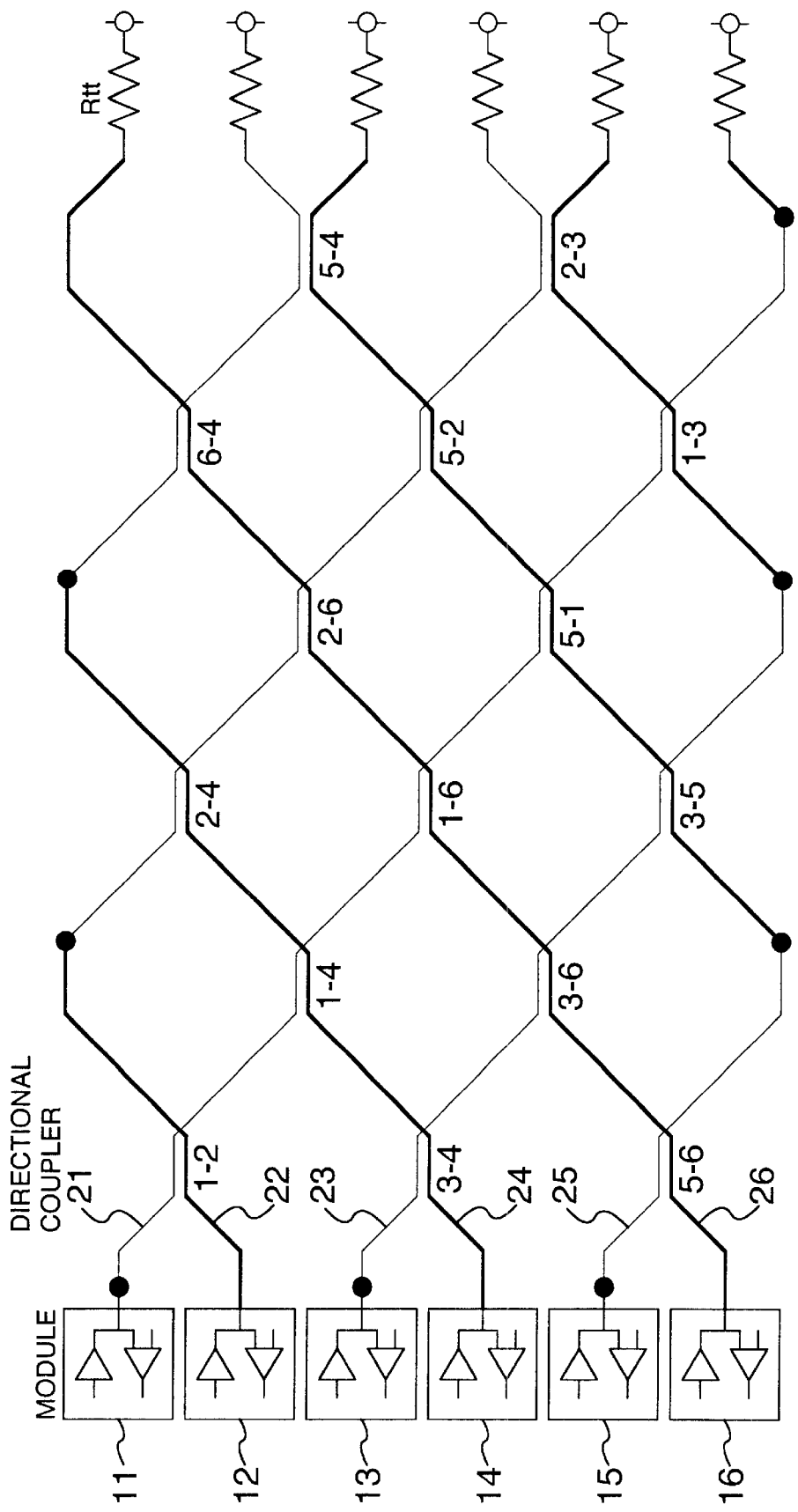
FIG. 4 is a diagram to explain an example of a directional coupler bus of the prior art to conduct a one-bit transfer between nodes.
Figure 7:
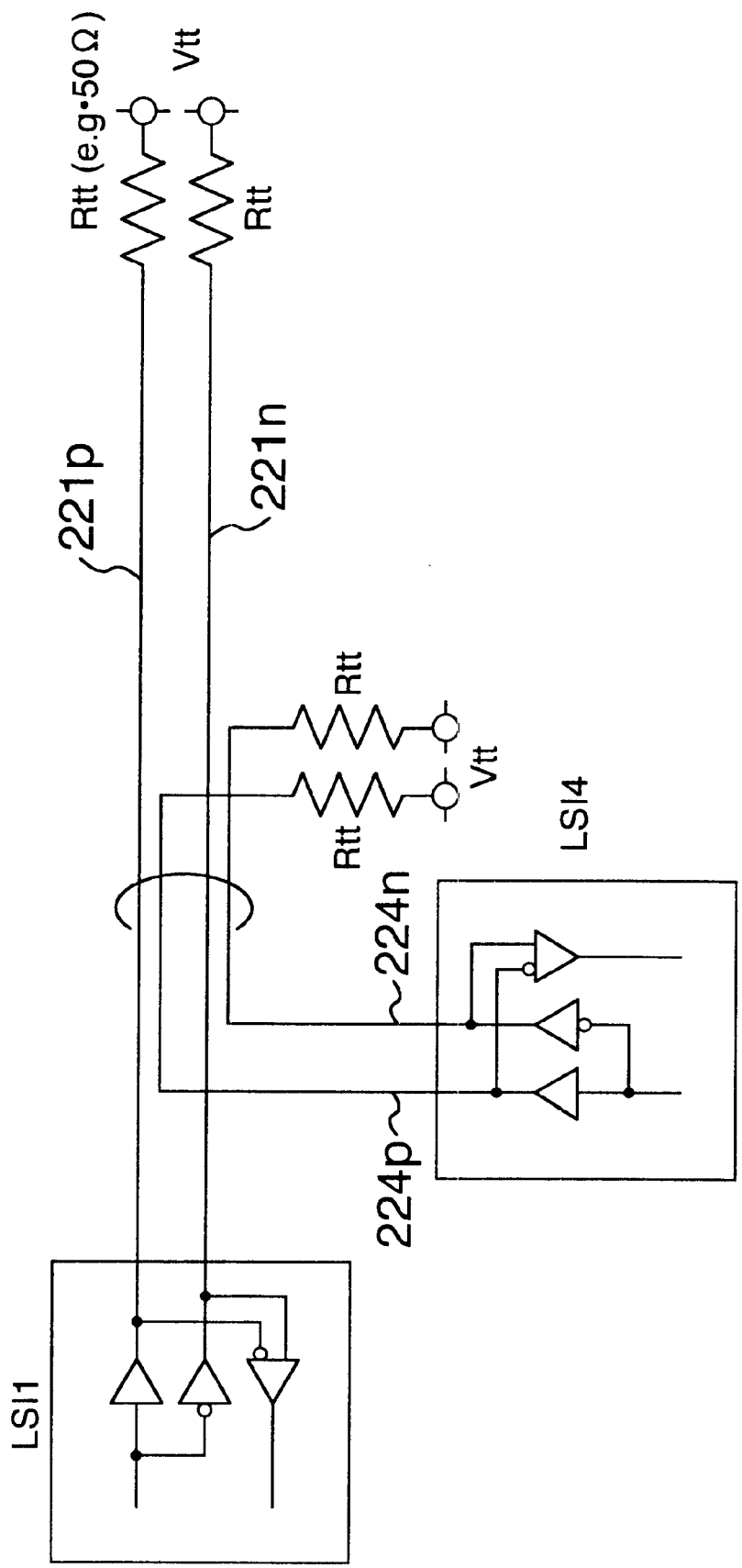
FIG. 7 is a circuit diagram showing a bus wiring example using a differential directional coupler.

FIG. 7 shows a circuit to transfer data using differential signals. This circuit includes wiring to transfer data between two LSI circuits, i.e., LSI1 and LSI4. The wiring is almost equal in configuration to the multi-coupling network of single-end type shown in FIG. 4. The configuration differs only in the number of signal lines for one bit, namely, two lines are disposed in this embodiment.

Figure 8:
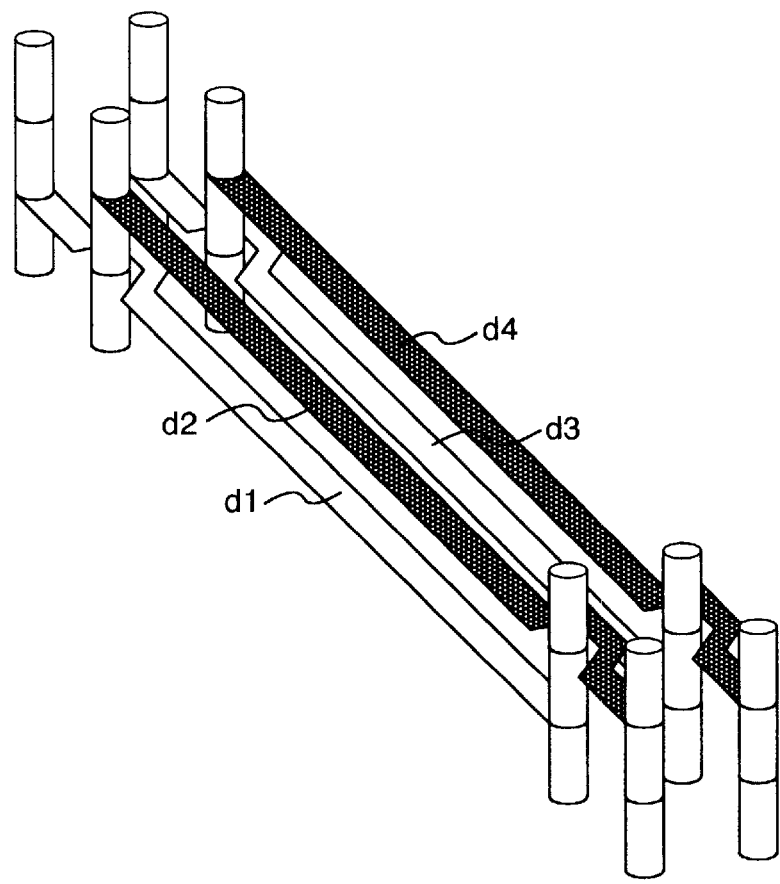
FIG. 8 is perspective view 1 showing a configuration of the differential directional coupler.
Figure 9:
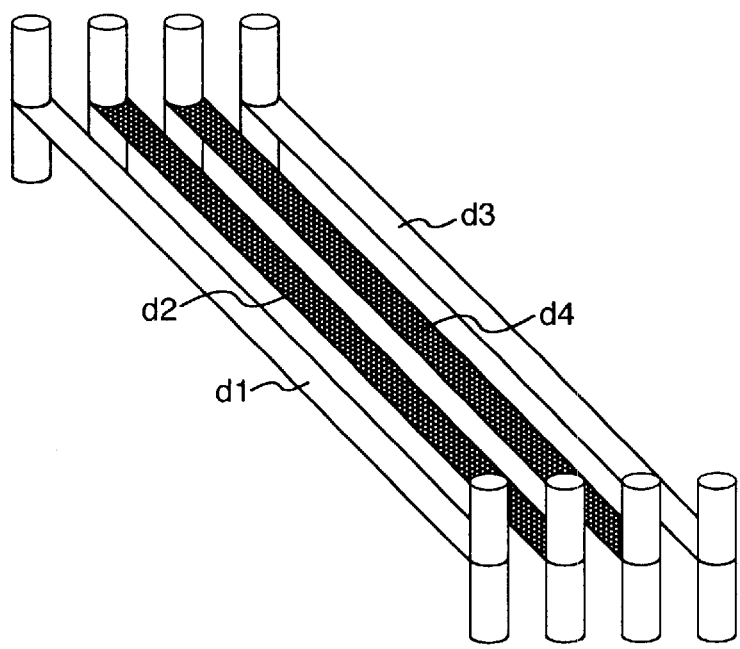
FIG. 9 is perspective view 2 showing a configuration of the differential directional coupler.

In FIG. 7, LSI1 and LSI4 communicate differential signals with each other. Signals from LSI1 are indicated by 221p and 221n and those from LSI4 are denoted by 224p and 224n. Each of the wiring lines 221p, 221n, 224p, and 224n terminates with matching termination at a termination resistor Rtt. The wiring lines configure directional couplers for differential signals as shown in FIGS. 8 and 9. For convenience of explanation, a ground pattern arranged to enclose the differential directional couplers is not shown.

FIG. 8 shows the differential couplers constructed using two signal layers and FIG. 9 shows those configured using one signal layer. FIGS. 8 and 9 are, like FIG. 2, perspective views of a signal line arrangement in which cylinders denote via holes.

In FIG. 8, wiring lines d1 and d3 in a first layer and wiring lines d2 and d4 in a second layer are respectively associated with differential signals from the respective LSI circuits. For example, referring to FIG. 7, signals 221p, 221n, 224p, and 224n correspond to wiring lines d2, d4, d1, and d3, respectively. In FIG. 9, a wiring pair d1 and d3 on an inner side and a wiring pair d2 and d4 on an outer side are associated with the respective differential signals from the respective LSI circuits. For example, in association with FIG. 7, signals 221p, 221n, 224p, and 224n respectively correspond to wiring lines d2, d4, d1, and d3.

Description will now be given of results of simulation for operational characteristics of the differential directional coupler.

FIG. 10 shows a cross-sectional structure of the differential directional coupler associated with FIG. 8.

Figure 12:
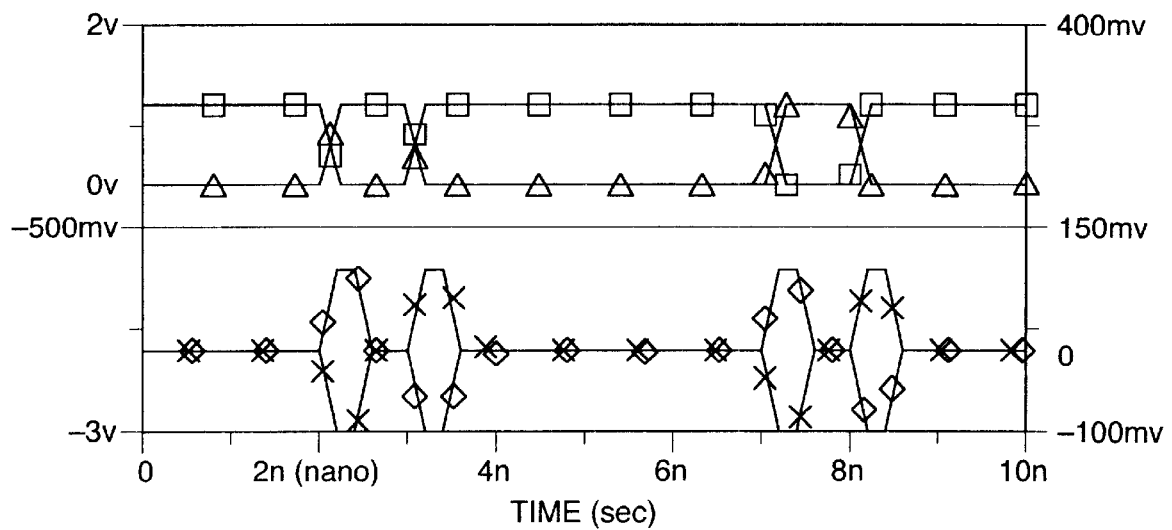
FIG. 12 is a graph showing waveforms of signals from the simulation circuit of FIG. 11.

When a signal, i.e., a rectangular pulsated wave propagates differential signal lines 224p and 224n, electromotive force induced between signal paths 221p and 221n is determined by dimensions and constitution of the wiring and a waveform of the propagation wave. FIG. 12 shows waveforms of signals induced under the condition below.

Wiring constitution of FIG. 10

| Wiring width | 100 micrometer ($\mu m$) |
|---|---|
| Wiring thickness | 30 $\mu m$ |
| Horizontal wiring gap | 200 $\mu m$ |
| Vertical wiring gap | 150 $\mu m$ |
| Minimum distance to plane | 150 $\mu m$ |
| Parallel line length L | 30 millimeters (mm) |

In this situation, the wiring lines 224p and 224p have an effective characteristic impedance of 53.87–j1.64 ohm in complex representation as a result of electro-magnetic field analysis, where $j^2=-1$.

Figure 11:
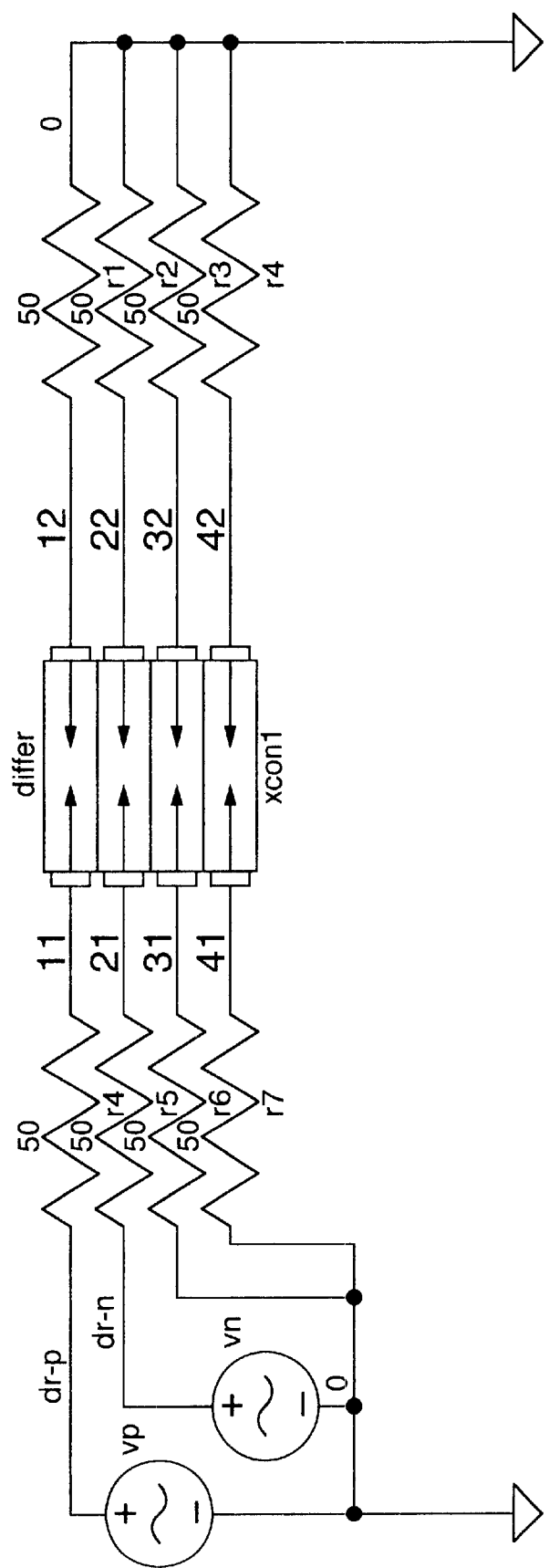
FIG. 11 is a diagram showing a simulation circuit to generate signals by a differential directional coupler.

FIG. 11 shows the simulation circuit in which each line is terminated with 50 ohm.

In FIGS. 11 and 12, the differential directional coupler system includes nodes 11, 21, 31, 41, 12, 22, 32, and 42. A wiring line between nodes 11 and 12 in FIG. 11 is wiring 224p in FIG. 10, and a wiring line between nodes 21 and 22 is wiring 224n in FIG. 11. Similarly, a line between nodes 31 and 32 is wiring 221p and a line between nodes 41 and 42 is wiring 221n.

As can be seen from FIG. 12, when a signal amplitude between terminals 11 and 21 of differential signals 224p and 224n of a data transfer source is 1.2 volt (V indicated on a left axis), a signal induced between terminals 31 and 41 of signal lines 221p and 2221n has an amplitude of ±90 millivolt (mV indicated on a left axis). The total amplitude is 180 mV. Namely, the amplitude is sufficient to discriminate signals generated from the differential directional coupler.

The pulse width is one nanosecond (ns), which namely leads to a transfer of one giga transfer per second (1 GT/s).

The principle is also applicable to a data transfer in a reverse direction. That is, data of a rectangular wave is propagated through differential signal lines 221p and 221n so that a signal having a signal waveform shown in FIG. 12 is generated between signal lines 224p and 224n. As a result, data can be transferred in the reverse direction.

As above, when a directional coupler is constructed by arranging two signal layers between two planes in a printed board configuration, it is possible to generate a signal necessary to transfer data between LSI circuits.

Such a signal can also be generated by a differential directional coupler similar to that shown in FIG. 9.

FIG. 13 shows a cross section of directional couplers including one wiring layer between power planes disposed in a multilayered printed board corresponding to FIG. 9.

Figure 15:
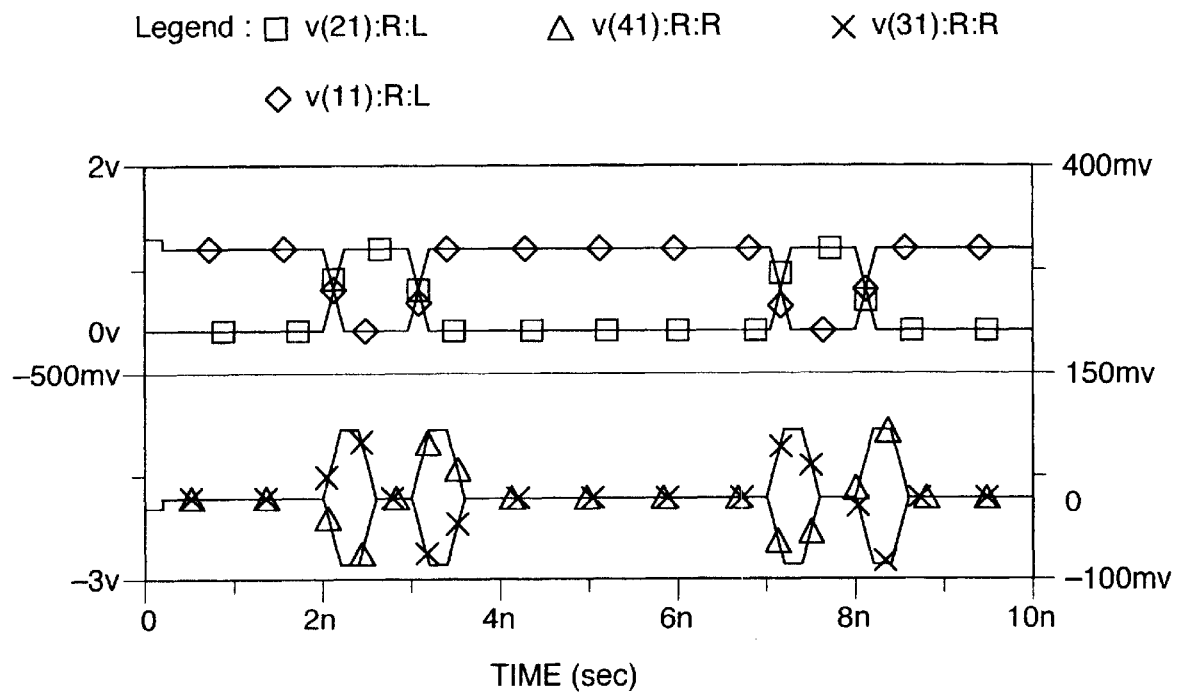
FIG. 15 is a graph showing waveforms of signals from the simulation circuit of FIG. 14.

In the configuration, differential drive signals propagate signal lines 221p and 221n on both sides to resultantly induce a signal between two lines 224p and 224n disposed between lines 221p and 221n. FIG. 15 shows results of simulation conducted by the circuit of FIG. 14.

The signal lines have dimensions as follows.

| Wiring width | 100 $\mu m$ |
|---|---|
| Wiring thickness | 30 $\mu m$ |
| Horizontal wiring gap | 200 $\mu m$ |
| Minimum distance to plane | 300 $\mu m$ |
| Parallel line length L | 30 mm |

By comparing FIG. 15 with FIG. 12, it is recognized that the induced signal has a similar amplitude of about ±90 mV.

Figure 16:
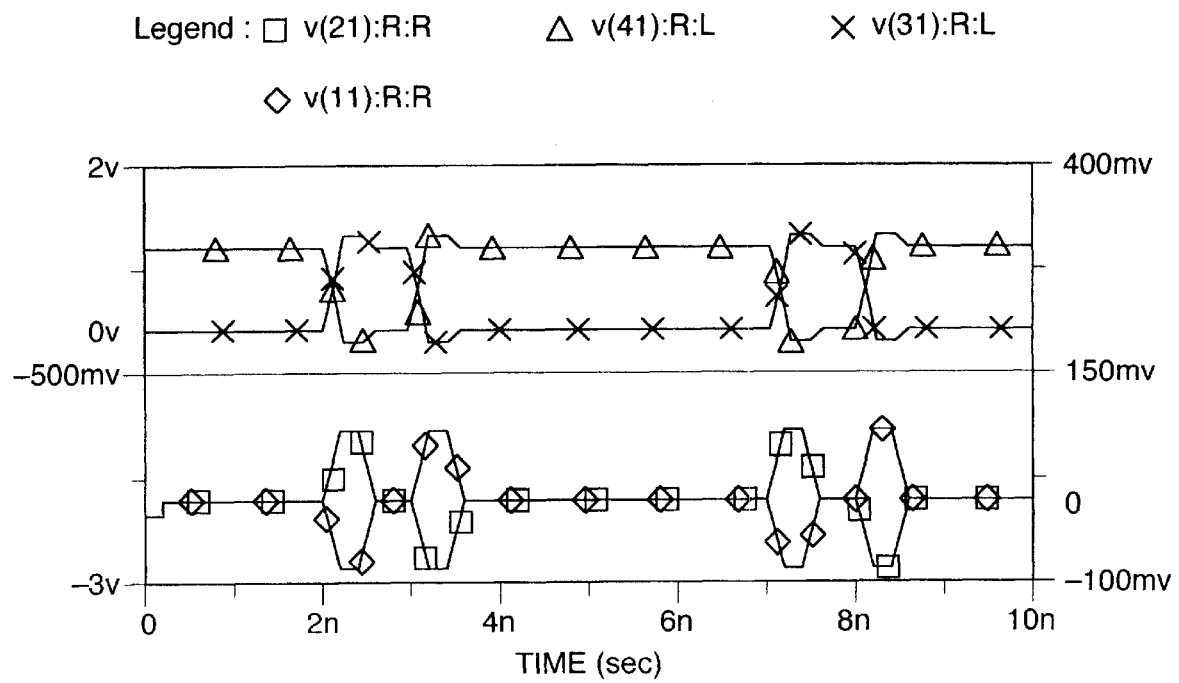
FIG. 16 is a graph showing waveforms from the simulation circuit of FIG. 14.

FIG. 16 shows a waveform of signals obtained by driving signal lines 224p and 224n of FIG. 13. The wiring configuration and dimensions are substantially the same as hose of FIG. 13.

When lines 224p and 224n are driven, a signal induced between terminals 11 and 21 of lines 221p and 221n has an amplitude of about ±90 mV. This means that the voltage induced in the differential directional coupler is almost kept unchanged between when the internal pair of signal lines are driven and when the external pair of signal lines are driven. Therefore, also in the configuration of FIG. 13 in which the differential directional coupler includes one signal layer, there is attained an 10 advantageous effect similar to that obtained when the coupler includes two signal layers as shown in FIG. 10.

Due to use of differential signals, the embodiment has a general advantage of differential signals, namely, is resistive against a common mode noise. Moreover, when compared with the wiring of single-end type of the first embodiment, the number of signals inputted to the receiver of FIG. 7 are doubled and the input signals between the terminals of the receiver has a high slew rate, which increases the operation speed of the receiver. Therefore, the second embodiment can operate at a higher speed than the first embodiment.

Additionally, the configuration of FIG. 13 has an advantage that only one signal layer is used, which lowers the manufacturing cost of the board.

As above, when intersection block b of FIG. 1A is constructed using a differential directional coupler of the type shown in FIGS. 8 and 9, it is possible to conduct a one-bit data transfer between nodes.

In this embodiment, an area occupied by a one-bit differential signal is about an area occupied by at most four wiring lines. Consequently, the similar configuration can be implemented also for a multi-bit bus by laterally arranging the wiring of FIG. 5 in a similar layout. That is, while the data transfer signal is generated by a directional coupler using two one-bit lines in FIG. 5, a data transfer signal resistive against a common mode noise can be generated by a directional coupler using four one-bit lines in this embodiment.

Thanks to the multilayered directional coupler of differential type, data can be transferred between LSI circuits also via a multi-bit bus. Moreover, there can be used a printed board of the prior art. This provides compatibility between a high-performance system and a low-priced system.

Embodiment 3

Description will be next given of a third embodiment of the present invention to increase multi-layered board mounting efficiency using constitution of FIG. 17.

In the first embodiment of FIG. 1, the directional couplers simply extends toward the right. specifically, intersection block b including a directional coupler indicated by hatching and block c not including a directional coupler are alternately arranged, which hence deteriorates wiring efficiency in the direction of thickness of the board. As shown in FIG. 17, when the wiring pattern is folded along line M—M indicated in FIG. 1A for reflection inversion, mounting efficiency can be increased.

In FIG. 17, for example, signal al from LSI1 travels in the lower-right direction to pass an intersection block associated with signal a4 and then changes its direction to proceed in the lower-left direction to intersect signal a5 indicated by a dotted line. Signal al further travels in the lower-left direction to intersect signal a6 indicated by a broken line, signal a3 denoted by a real line, signal a2 indicated by a dot-and-dash line, and then terminates at resistor Rtt1. This means that signal a intersects (directionally couples with) the signals from all other LSI circuits while keeping the backward direction in its travel. Similarly, any wiring line from another LSI circuit also intersects the other wiring lines in the same intersection structure as above.

Wiring from the final coupling area of each line to its termination resistor may pass any block not hatched in FIG. 17, namely, any place not coupled with any other line. For example, the termination resistor Rtt4 of the line from LSI4 has a final directional coupling point with line a6 from LSI6. Resistor Rtt4 then extends up to the surface of the board. In this situation, it is only necessary to extend Rtt4 with a predetermined impedance kept unchanged while preventing the extended line from being coupled with any other line.

Thanks to the wiring layout thus folded, the mounting efficiency can be improved without increasing the number of layers of the board. Moreover, the size of board necessary to implement the directional coupler configuration can be advantageously minimized. As a result, the board price is lowered and the restriction imposed on the board mounting is mitigated to increase the degree of freedom of the board design. Moreover, the chassis or enclosure of the system can also be decreased in size. This increases the mounting density of the board and hence reduces the area of the chassis of the system.

The advantage above can be obtained not only by the directional coupling of single-end type but also by the directional coupling of differential type.

FIG. 8 shows a mounting layout of a directional coupler system of center plane type. The configuration includes a printed board 1 on which directional couplers of the first or third embodiment are mounted, the number of couplers being represented by expression (1) above. Connected via connectors to board 1 are daughter substrates 2-1 to 2-6 on which LSI1 to LSI6 are respectively mounted. LSI1 is connected to printed board 1 via wiring of daughter substrate 2-1 and a connector.

Due to the configuration, a daughter substrate to be connected to a directional coupling bus, namely, a data processing function supported by the daughter substrate can be easily added to the system. With respect to the direct current, the wiring lines are not connected to each other in the bus, which consequently allows line insertion. This advantageously improves availability of the system.

Embodiment 4

Figure 19A:
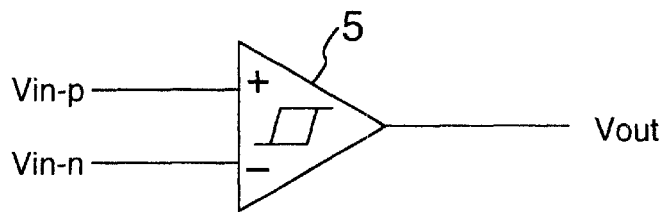
FIGS. 19A to 19C are diagrams to explain a differential comparator with hysteresis for a directional coupler bus.
Figure 19B:
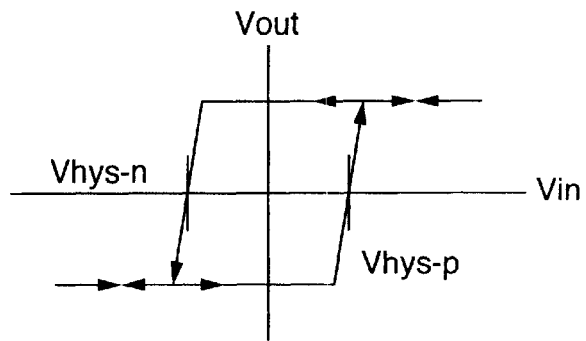
Figure 19C:
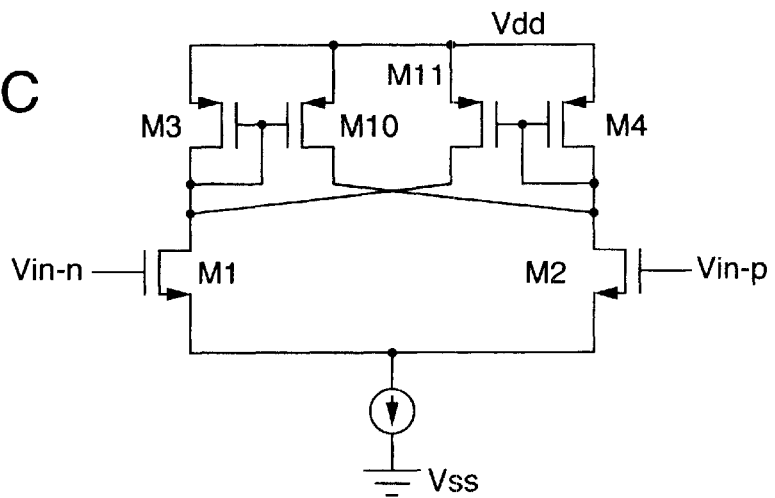

Referring now to FIGS. 19A to 19C, description will be given of an embodiment in which a differential receiver having hysteresis is applied to the second embodiment.

The configuration of FIG. 19A includes a differential input circuit of hysteresis type in which an output voltage therefrom Vout varies in response to differential input signals Vin-n and Vin-p. Input circuit 5 is linked with to a differential lines connected to the differential directional coupler of the second embodiment. Therefore, the input signal is a signal v (41) indicated by a parallelogram or v (31) denoted by a letter X in FIG. 12. Similarly, the input signal is a signal v (41) indicated by a triangle or v (31) denoted by a letter X in FIG. 15.

Operation of receiver 5 will be described by referring to FIG. 19B.

The configuration of FIG. 19B includes a voltage difference Vin between differential input voltages Vin-p and Vin-n to receiver 5 and an output voltage Vout from receiver 5. In FIG. 19B, input voltage difference Vin has a threshold voltage which varies between the rising and falling edges. The rising and falling threshold voltages are denoted as Vhys-p and Vhys-n, respectively.

When input voltage Vin is equal to or less than Vhys-n, Vout is "L". When input voltage Vin increases in this state, output voltage Vout changes to "H" if Vin exceeds rising threshold voltage Vhys-p. When input voltage Vin decreases thereafter, Vout becomes "L" if Vin becomes less than falling threshold voltage Vhys-n. Depending on the state of output voltage Vout from receiver 5, input threshold voltages Vhys-n and Vhys-p take different values in this way. Consequently, when positive-going and negative-going pulse signals of FIG. 12 or 15 are alternately inputted to receiver 5, output Vout therefrom can be detected as a drive waveform of the directional coupler.

When the noise ratio is about 10% of the peak voltage of the voltage difference Vin in the differential coupler, voltages Vhys-p and Vhys-n need only be about 15% to about 85% thereof in consideration of a margin of 5%.

Since Vin is ±180 mV in FIG. 12, Vhys-p need only range from 13.5 mV to 76.5 mV and Vhys-n need only range from −13.5 m to 76.5 mV. This indicates naturally the difference with respect to termination voltage Vtt at termination of the pertinent line.

FIG. 19C shows a general example of an initial stage of the input circuit of receiver 5. This configuration is similar to that of a circuit example described, for example, in page 352 of "CMOS Analog Circuit Design" written by Phillips E. Allen and Douglas R. Holberg (1987). Thanks to the circuit above, the differential circuit having hysteresis can be simply configured. Since no signal propagates through the bus in an idle state in which data is not being transferred via the bus, the potential becomes substantially equal to the termination voltage and the p side and the n side of the input signal of the differential receiver are almost at an identical potential. Even in this situation, receiver 5 operates in a stable state without causing oscillation or the like thanks to an advantageous function of hysteresis.

Figure 20:
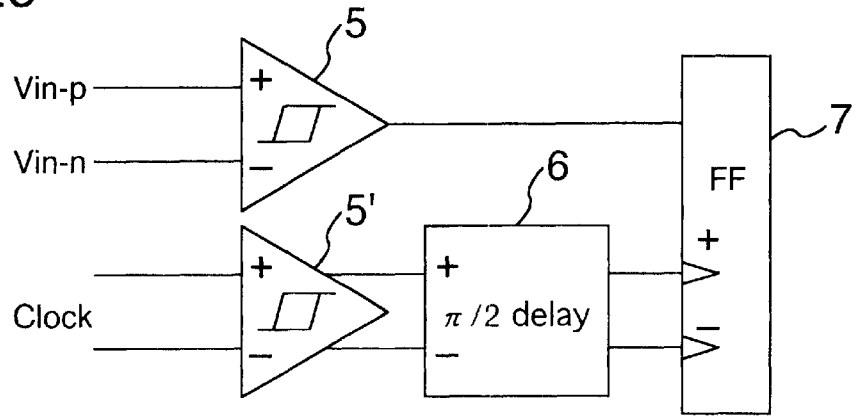
FIG. 20 is a diagram showing a configuration of a data latch system using a differential comparator with hysteresis of source clock synchronous type.

Referring next to FIG. 20, description will be given of a data transfer method using the circuit above. This method uses a source clock synchronous transmission suitable for a high-speed operation. In the source clock synchronous transmission, there is provided on a bus a strobe signal (source clock signal) which is equal in the wiring configuration to data (the same format with respect wiring lines). When data is transmitted from an LSI circuit, the strobe signal is sent therefrom almost at the same time. Having received the data and the strobe signal, an LSI circuit latches the data using the strobe signal.

The data and the source clock signal transferred in the source clock synchronous transmission are received by receivers 5 and 5', respectively. Receivers 5 and 5' are differential circuits including hysteresis to detect the data and the clock signal, respectively. The data detected is latched by a flip-flop (FF) circuit 7 of differential input type in response to the clock signal. Specifically, the clock signal used to latched the data is obtained by shifting the clock signal 90° (π/2) by a phase delay circuit 6 and is then fed to flip-flop circuit 7. Flip-flop circuit 7 includes two clock input terminals "+" and "−", which are used to latch data respectively at the rising and falling edges of the clock signal. These terminals are effective when the data transfer speed is substantially equal to that of the clock signal.

Phase delay circuit 6 has an offset, which is used, when the phases respectively of the clock input signal (Clock) and the data (Vin) are substantially equal to each other with respect to time respectively at the input terminals of receivers 5 and 5', to maximize a data setup time to latch data using the clock signal (Clock).

Phase delay circuit 6 of differential type is employed to correct a clock duty ratio which varies due to fluctuation of drivability of Vhys-p, Vhys-n of receiver 5' and "L" and "H" of data of an output stage of receiver 5'. Thanks to the differential type, even when the phases respectively of the p and/or n signals are slightly shifted from each other at the rising and/or falling edges, the central portion of the data (signal) can be transferred in any cases.

Figure 21:
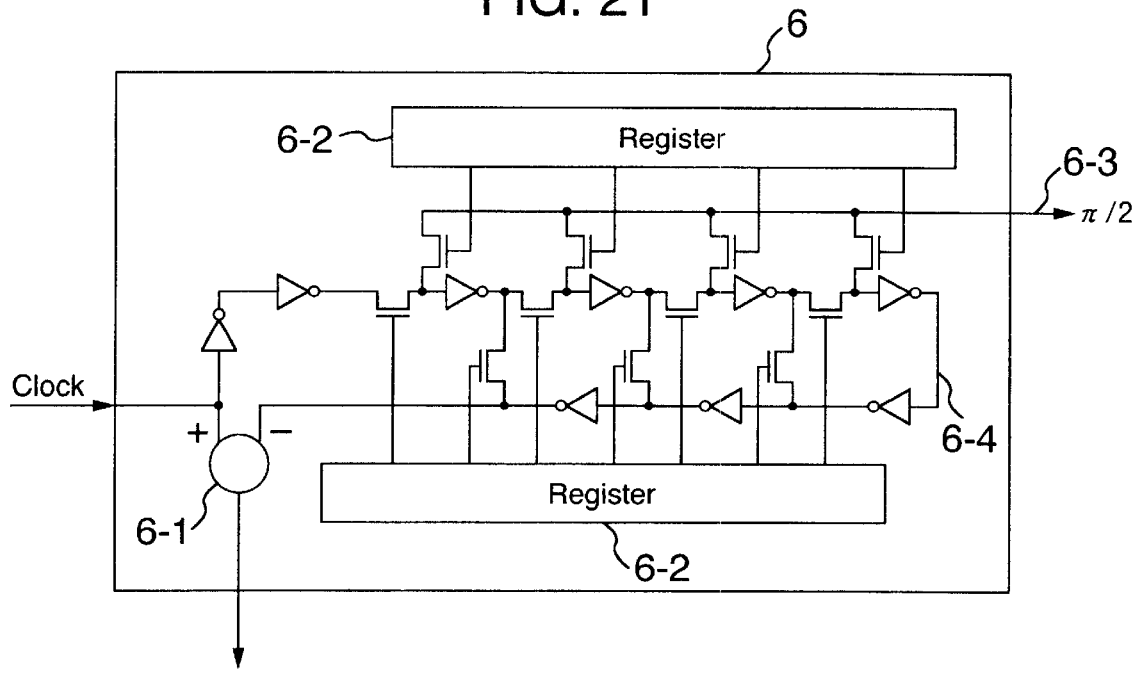
FIG. 21 is a diagram showing structure of a phase delay circuit (90° digital phase shifter)

FIG. 21 shows a circuit example of signal delay circuit 6. Although the differential signals are indicated by one line (circuit) for simplicity in this diagram, all signals are actually of the differential type.

A phase detector 6-1 compares the phase of the clock signal (Clock) inputted with a clock signal fed back thereto. A register 6-2 contains data to control a delay amount. According to the data, the phase of the clock signal is shifted 90° to produce a signal 6-3. The phase shift operation is controlled as follows. A delay amount of a ring 6-4 constituting a delay circuit is appropriately set by selecting a route of the pertinent signal so that the delay amount becomes substantially equal to a period of the clock signal (Clock). A switch is then disposed at a position of ring 6-4 associated with a half of the period to obtain an output signal thus shifted by 90° . Register 6-2 keeps therein the route selecting information of ring 6-4 and the switch selecting information.

The values of register 6-2 are determined before data is transferred via the bus and are adjusted when the system is started and at an interval of time in which the ambient temperature is assumed to be fixed.

Register 6-2 is set as follows. Phase comparator 6-1 writes a value in register 6-2 to adjust the signal route of ring 6-4, the value substantially equalizing the phase of the input clock signal (Clock) to that of the input signal having passed ring 6-4. First, for a shortest route, a controller, not shown, sets register 6-2 and conducts the phase comparison. If a phase difference is resultantly detected, phase comparator 6-1 sends a signal as a feedback signal to a circuit, not shown, to control phase delay circuit 6, which sets register 6-2 to elongate the route of 6-4 to a next longer route. Thereafter, the phase comparison is again carried out. The discrepancy between the phase of the clock signal (Clock) and that of the signal from ring 6-4 is gradually minimized and hence the output from phase comparator 6-1 is lowered. However, if this operation is continuously accomplished, the delay of ring 6-4 becomes greater at a point and then the output from phase comparator 6-1 enters a state to increase its value.

The position where the output from phase comparator 6-1 becomes greater is determined to be a point where the phase of the input clock (Clock) is most similar to that of the signal from ring 6-4.

In this fashion, register 6-2 is set so that the delay time of the phase becomes substantially equal for the input clock signal and the signal from ring 6-4. As a result, a 90° phase is compensated. Even in the source synchronous transmission, the 90° phase difference can be kept retained between the clock signal (Clock) and the data to thereby increase reliability of the data transfer.

It is desirable that the phase correction is achieved not only after the reset but also at a fixed interval of time. This copes with the variation of delay when the ambient temperature is changed. Thanks to the differential signals, it is possible to correct variation in the clock duty ratio due to a slight difference in the phases of the p and n signals at the rising and/or falling edges and hence due to fluctuation of drivability of Vhys-p, Vhys-n of receiver 5' and "L" and "H" of data of an output stage of receiver 5'. Consequently, the central portion of the data can be transferred in any situation.

Figure 22A:
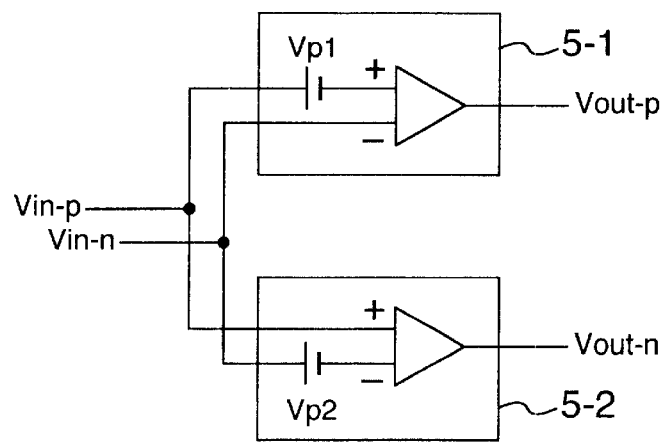
FIGS. 22A and 22B are a configuration diagram and a graph to explain a differential comparator with a voltage offset for a directional coupler bus.
Figure 22B:
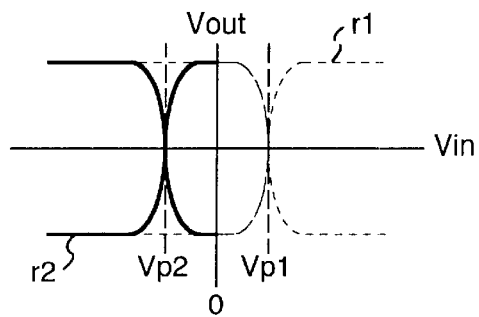

Referring next to FIGS. 22A and 22B, description will be given of another embodiment of the receiver.

FIG. 22A shows a circuit example of a receiver including two differential comparators. When input voltages Vin-p and Vin-n are inputted, offset voltages Vp1 and Vp2 are added respectively thereto and the resultant voltages are supplied to comparators 5-1 and 5-2, respectively. Although Vp1 and Vp2 are indicated by batteries in FIG. 22A, such batteries are not actually used, namely, an offset voltage is added to a reference voltage of each comparator.

FIG. 22B shows a relationship between the input and output voltages of comparators 5-1 and 5-2. Specifically, r1 and r2 represent the output-versus-input voltage relationships of comparators 5-1 and 5-2, respectively. Comparator 5-1 outputs an "H" data level from Vout-p when the amplitude of a signal on a positive ("+") side is larger than that of a signal on a negative ("−") side by Vp1. On the other hand, comparator 5-2 outputs an "L" data level from Vout-n when the amplitude of the signal on the "−" side is less than that of the signal on the "+" side by Vp1. Therefore, comparators 5-1 and 5-3 (FIG. 23) detect a rising edge of a wave driven by a directional comparator and comparators 5-2 and 5-4 (FIG. 23) detect a falling edge of a wave driven by a directional coupler.

Offset voltages Vp1 and Vp2 are obtained by asymmetrically setting gate widths of feedback transistors M10 and M11 in FIG. 19C. That is, when transistor M10 is larger in the gate width than transistor M11, Vin-p has a larger feedback amount and hence an offset appears in its hysteresis.

Figure 23:
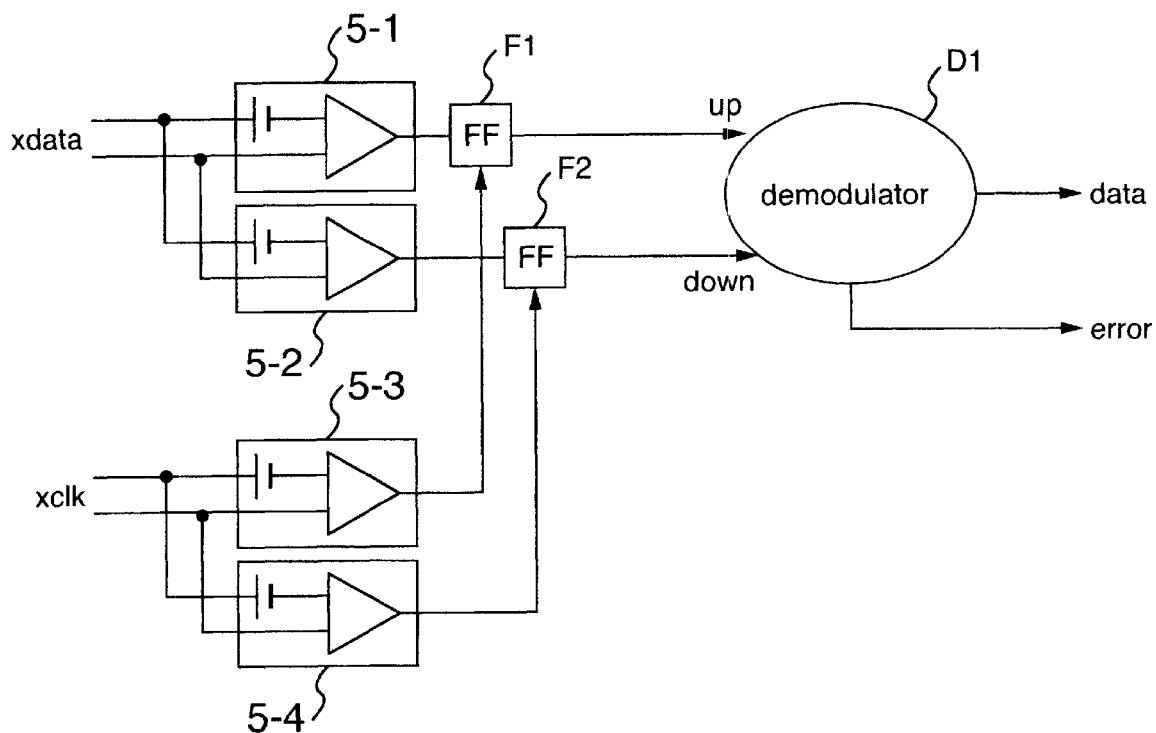
FIG. 23 is a diagram showing structure of a data latch system using a differential comparator with a voltage offset.

Referring now to FIG. 23, description will be given of a data detection circuit including a receiver.

Comparators 5-1 and 5-2 and comparators 5-3 and 5-4 each having an offset voltage respectively receive positive and negative signals of differential signals of data (xdata) and a clock signal (xclock) which are modulated by a directional coupler system. Signals detected by comparators 5-1 and 5-2 are respectively fed to flip-flop circuits F1 and F2 to be latched therein at a point of time when clock signal xclk is detected by comparators 5-3 and 5-4. Flip-flop circuits F1 and F2 produces output signals, i.e., up and down signals, respectively. According to the up and down signals, a detector circuit (demodulator) D1 detects data and an error state as follows.

Signals xdata and xclock may be of the same phase or signal xclock may be 90° delayed in phase. When these signals are in the same phase, it is only required to use the phase shifter shown in FIG. 21 to provide the phase difference therebetween.

Figure 24:
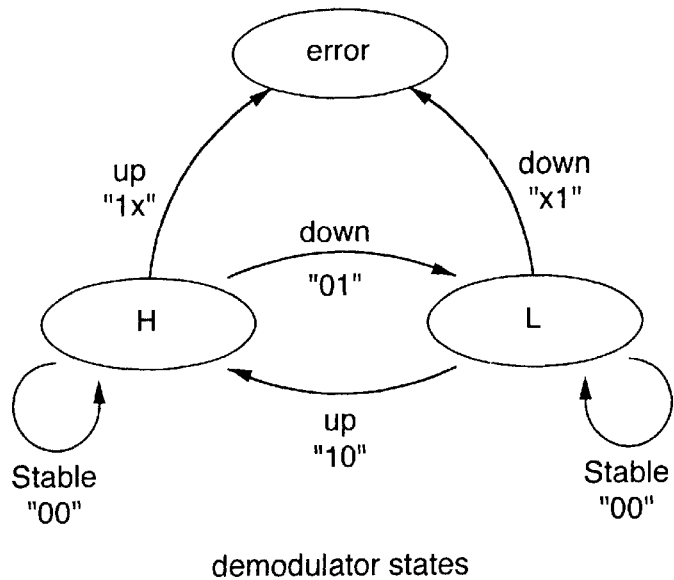
FIG. 24 is a diagram showing state transitions of an error detection circuit (modulator)

Referring next to FIG. 24, description will be given of a function of the detector circuit. FIG. 24 shows state transitions of the demodulator in response to input signals, i.e., up and down signals.

The demodulator has three states, namely, states of "H", "L", and "error". In "H" and "L", the demodulator outputs respective data.

Since comparator 5-1 of FIG. 23 detects a rising edge of a wave driven by a directional coupler, the output of the signal indicates a rising edge in any situation. Similarly, comparator 5-2 detects a falling edge of a wave driven by a directional coupler, the output of the signal indicates a falling edge in any situation. Assume that the up and down signals are represented by two bits and the up signal is assigned to an upper bit thereof. When a signal of "10" is inputted to detector circuit D1 in the "L" state, detector circuit DI goes to the "H" state. On the other hand, when a signal of "01" is inputted to detector circuit D1 in the "H" state, detector circuit D1 enters the "L" state. However, it is principally impossible that a rising edge of the signal appears when detector circuit D1 is in the "H" state. Therefore, when a signal of "1x" is inputted to detector circuit D1 in the "H" state, detector circuit D1 enters the "error" state to output an error signal. Similarly, when a signal of "x1" is inputted to detector circuit D1 in the "L" state, detector circuit D1 changes its state to the "error" state to output an error signal. When a signal of "00" representing no input is received, detector circuit D1 keeps the state thereof.

According to the up and down signals, the data and the error can be detected as above.

The operation will be described by referring to FIG. 25. In the description, a period of time required for the data or signal transmission is assumed to be zero for simplicity of explanation.

Figure 25:
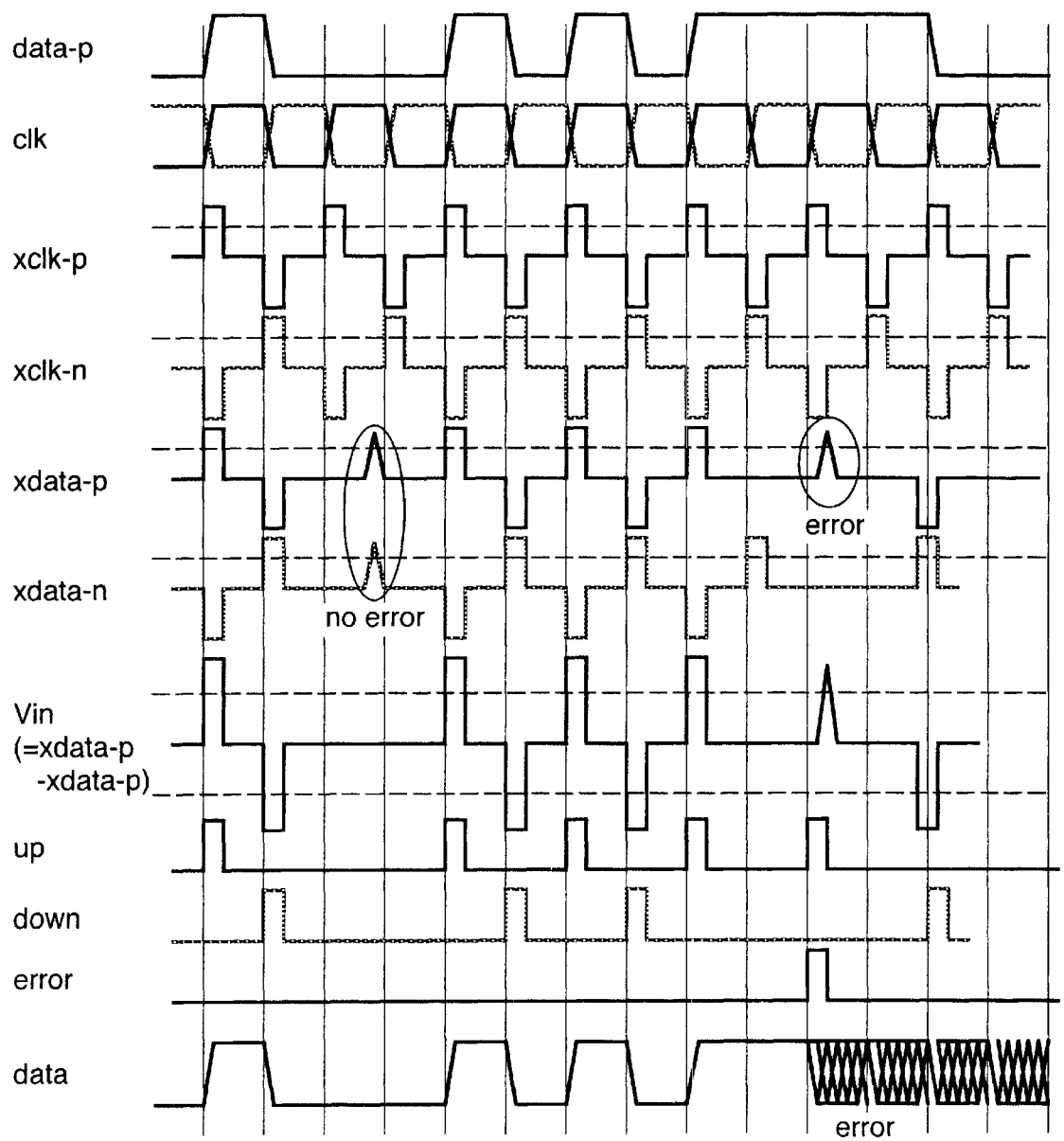
FIG. 25 is a graph showing waveforms in respective stages of the circuit of FIG. 23.

A signal data-p is a data pattern from a transmission source and only a positive-logic signal is shown in FIG. 25. It is to be understood that a signal obtained by reversing this signal is also transmitted as a differential signal.

At timing synchronized with the data, the transmission source LSI circuit transmits a differential clk signal.

Signals xclk and xdata are produced by a directional coupler at rising and falling edges of signals data and clk, respectively. Two noise signals each enclosed by a circle are superimposed onto these signals (at two positions). Vin is an input voltage difference of the receiver, namely, a difference between xdata-p and xdata-n.

The first error is a common mode (in-phase) noise and is superimposed onto xdata-p and xdata-n. In this situation, the noise does not appear in Vin and hence no error occurs.

It can be seen from FIG. 25 that if there exists no error, data can be appropriately demodulated according to the up and down signals.

Next, when a differential noise (second noise) is superimposed, an error takes place.

Advantageously, this error less frequently appears in differential mode signals. At occurrence of this error, the noise appears in xdata-p. As a result, the up signal continues in the error occurrence field and hence demodulator circuit D1 changes its state to the error state.

However, this circuit cannot detect an error in which the differential noise appears on the "n" side and the up and down signals continue. To overcome this difficult, it is to be appreciated that an error correction code (ECC) is added to data itself to achieve an error check according to the error correction code.

When an error occurs, the same bus transaction is processed (re-send or retransmission) to repeatedly conduct the retransmission until the error is removed. This is because the noise occurs at random in most cases.

In accordance with the embodiments of the present invention, thanks to the configuration of the demodulator circuit, the error detection can be advantageously carried out before the ECC check is initiated. Data can be transferred at a high speed using a directional coupler. The data transfer can be achieved without causing errors.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An electronic apparatus, comprising:
   a plurality of modules each including an interface circuit to transfer digital data;
   a bus system connecting the modules to each other;
   a printed wiring board on which the modules are mounted;
   a termination resistor for matching termination of each lead signal line from the modules;
   a directional coupler including part of a lead wiring line extending from a first one of the modules and terminating at the termination resistor and part of a lead wiring line extending from each second and subsequent ones of the modules;
   a via hole of non-through type which establishes connection of the directional coupler between the modules; and
   two directional couplers disposed at upper and lower positions, respectively in said printed wiring board among directional couplers, used for signal transfer between the modules being connected to each other by said via hole of non-through type to thereby transfer data between the modules.

2. An electronic apparatus comprising:
a plurality of modules each including an interface circuit to transfer digital data;
a bus system connecting the modules to each other;
a printed wiring board on which the modules are mounted;
a termination resistor for matching termination of each lead signal line from the modules;
a directional coupler including part of a lead wiring line extending from a first one of the modules and terminating at the termination resistor and part of a lead wiring line extending from each second and subsequent ones of the modules; and
a via hole of non-through type which establishes connection of the directional coupler between the modules,
wherein the modules thus connected to each other communicating data therebetween, and
wherein the lead lines of the directional coupler each have a length is larger than 30 mm and less than 40 mm.

3. An electronic apparatus comprising:
a plurality of modules each including an interface circuit to transfer digital data;
a bus system connecting the modules to each other;
a printed wiring board on which the modules are mounted;
a termination resistor for matching termination of each lead signal line from the modules;
a directional coupler including part of a lead wiring line extending from a first one of the modules and terminating at the termination resistor and part of a lead wiring line extending from each second and subsequent ones of the modules; and
a via hole of non-through type which establishes connection of the directional coupler between the modules,
wherein the directional coupler is connected (between the modules) by a via hole of non-through type.

4. An electronic apparatus in accordance with claim 3, wherein digital signals from the modules are differential signals; and
wherein the directional coupler which transmits signals from a functional element of a first one of the modules to a functional element of a second one of the modules is a differential type.

5. An electronic apparatus in accordance with claim 4, wherein the differential directional coupler includes two signal layers enclosed by power planes of the printed wiring board;
wherein differential signal lines from the functional element of the first one of the modules are arranged to parallel with each other in a first one of the signal layers;
wherein differential signal lines to the functional element of the second one of the modules are arranged in a second one of the signal layers, the differential signal lines being positionally matching in the vertical direction with the differential signal lines in the first one of the signal layers.

6. An electronic apparatus in accordance with claim 4, wherein the differential directional coupler includes one signal layer enclosed by power planes of the printed wiring board;
wherein differential signal lines from the functional element of the first one of the modules are arranged to parallel with each other in the signal layer;
wherein differential signal lines to the functional element of the second one of the modules are arranged in the signal layer, the differential signal lines being on both sides of the differential signal lines from the functional element of the first one of the modules.

7. A directional coupling bus system in a combination of a plurality of modules, each including an interface circuit to transfer digital data, a bus system connecting the modules to each other, and a printed wiring board on which the modules are mounted, wherein each lead signal line extending from one of the modules and terminating at a termination resistor with impedance matching, said directional coupling bus system comprising:
a directional coupler including part of a lead wiring line extending from a first one of the modules and terminating at the termination resistor and part of a lead wiring line extending from each of second and subsequent ones of the modules being sequentially configured in a direction of thickness of the board; and
two directional couplers disposed at upper and lower positions, respectively in said printed wiring board among directional couplers, used for signal transfer between the modules being connected to each other by said via hole of non-through type to thereby transfer data between the modules.

8. A directional coupling bus system in a combination of a plurality of modules, each including an interface circuit to transfer digital data, a bus system connecting the modules to each other, and a printed wiring board on which the modules are mounted, wherein each lead signal line extending from one of the modules and terminating at a termination resistor with impedance matching, said directional coupling bus system comprising:
a directional coupler including part of a lead wiring line extending from a first one of the modules and terminating at the termination resistor and part of a lead wiring line extending from each of second and subsequent ones of the modules being sequentially configured in a direction of thickness of the board,
wherein the modules thus connected communicate data therebetween,
wherein the directional coupler includes two adjacent lines in one signal layer enclosed with ground planes, and
wherein the directional coupler is connected (between the modules) by a via hole of non-through type.

9. A directional coupling bus systemin a combination of a plurality of modules, each including an interface circuit to transfer digital data, a bus system connecting the modules to each other, and a printed wiring board on which the modules are mounted, wherein each lead signal line extending from one of the modules and terminating at a termination resistor with impedance matching, said directional coupling bus system comprising:
a directional coupler including part of a lead wiring line extending from a first one of the modules and terminating at the termination resistor and part of a lead wiring line extending from each of second and subsequent ones of the modules being sequentially configured in a direction of thickness of the board,
wherein modules thus connected communicate data therebetween,
wherein digital signals from the modules are differential signals, and wherein signals are transmitted from a functional element of a first one of the modules to a functional element of a second one of the modules by a directional coupler of differential type.

10. A printed board constituting a directional bus coupling system in a combination of a plurality of modules, each including an interface circuit to transfer digital data, a bus system connecting the modules to each other, and a printed wiring board on which the modules are mounted, wherein each lead signal line extending from one of the modules and terminating at a termination resistor with impedance matching, said directional coupling bus system comprising:

a directional coupler including part of a lead wiring line extending from a first one of the modules and terminating at the termination resistor and part of a lead wiring line extending from each of second and subsequent ones of the modules being sequentially configured in a direction of thickness of the board, wherein the modules thus connected communicate data therebetween, wherein each directional coupler of differential type includes two signal layers enclosed by power planes of the printed wiring board, wherein differential signal lines from at least one functional element of the first one of the modules are arranged to be parallel with each other in a first one of the signal layers, and wherein differential signal lines to at least one functional element of the second one of the modules are arranged in a second one of the signal layers, the differential signal lines being positionally matching in the vertical direction with the differential signal lines in the first one of the signal layers.

11. A printed board including the printed wiring board of claim 10, further comprising:

ground layers;

n functional elements (n≧2) mounted on the printed board;

m signal layers each including two layers or one layer for constituting differential directional couplers;

signal planes and ground planes in pairs arranged in the printed board, where m=n−1; and P directional couplers disposed to transfer data between n modules, where P=n (n−1)12, wherein the P directional couplers being alternately arranged in a direction of thickness of the printed board.

12. A bus system including a printed wiring board in accordance with claim 11, wherein the set of P directional couplers is successively arranged to increase a wiring density of the board.

13. A printed board constituting a directional bus coupling system in a combination of a plurality of modules, each including an interface circuit to transfer digital data, a bus system connecting the modules to each other, and a printed wiring board on which the modules are mounted, wherein each lead signal line extending from one of the modules and terminating at a termination resistor with impedance matching, said directional coupling bus system comprising:

a directional coupler including part of a lead wiring line extending from a first one of the modules and terminating at the termination resistor and part of a lead wiring line extending from each of second and subsequent ones of the modules being sequentially configured in a direction of thickness of the board, wherein the modules thus connected communicate data therebetween, wherein each differential directional coupler includes one signal layer enclosed by power planes of the printed wiring board, wherein differential signal lines from at least one functional element of the first one of the modules are arranged to be parallel with each other in the signal layers and wherein differential signal lines to at least one functional element of the second one of the modules are arranged in the signal layers, the differential signal lines being on both sides of the differential signal lines from the functional element of the first one of the modules.

14. A printed board including the printed wiring board of claim 13, further comprising:

ground layers;

n functional elements (n≧2) mounted on the printed board;

m signal layers each including two layers or one layer for constituting differential directional couplers;

signal planes and ground planes in pairs arranged in the printed board, where m=n−1;

P directional couplers disposed to transfer data between n modules, where P=n (n−1)/2, wherein the P directional couplers being alternately arranged in a direction of thickness of the printed board.

15. A directional coupling bus system in a combination of a plurality of modules, each including an interface circuit to transfer digital data, a bus system connecting the modules to each other, and a printed wiring board on which the modules are mounted, wherein each lead signal line extending from one of the modules and terminating at a termination resistor with impedance matching, said directional coupling bus system comprising:

a directional coupler including part of a lead wiring line extending from a first one of the modules and terminating at the termination resistor and part of a lead wiring line extending from each of second and subsequent ones of the modules being sequentially configured in a direction of thickness of the board, wherein the modules thus connected communicate data therebetween, further including a receiver, and wherein the receiver including a differential comparator having hysteresis.

16. A directional coupling bus system of a source clock synchronous transmission in accordance with claim 15, further including a receiver for receiving data and clock signals, wherein the receiver including differential comparators each having hysteresis, and wherein the data being latched by a signal obtained by shifting the clock signal 90° in phase.

17. A directional coupling bus system in a combination of a plurality of modules, each including an interface circuit to transfer digital data, a bus system connecting the modules to each other, and a printed wiring board on which the modules are mounted, wherein each lead signal line extending from one of the modules and terminating at a termination resistor with impedance matching, said directional coupling bus system comprising:

a directional coupler including part of a lead wiring line extending from a first one of the modules and terminating at the termination resistor and part of a lead wiring line extending from each of second and subsequent ones of the modules being sequentially configured in a direction of thickness of the board, wherein the modules thus connected communicate data therebetween, further including a receivers for receiving data and clock signals, wherein the receiver including two differential comparators each having an offset, and wherein one of the comparators having a positive offset and the other one thereof having a negative offset.

18. A directional coupling bus system in accordance with claim 17, further including a receiver for receiving data and clock signals, wherein the receiver including differential comparators each having hysteresis, and wherein the data being latched by a signal obtained by shifting the clock signal 90° in phase.

19. A demodulator circuit for use with a directional coupling bus system in accordance with claim 18, wherein a data signal differential signal from a receiver is latched in response to a clock signal differential signal from the receiver, wherein the demodulator circuit changes a state thereof from a logical low level (L) to a logical high level (H) when an up signal is inputted, wherein the state changes from "H" level to "Error" state when an up signal is input, and wherein the state changes from "L" to "Error" at a down signal input, thereby outputting data or an error signal in accordance with the state.

20. A directional coupling bus system including the demodulator circuit in accordance with claim 19.

21. In a combination of a directional coupler, a receiver, and a demodulator; an error detection circuit of the combination comprises:

a directional coupler disposed on a substrate;

a receiver for receiving a signal from the coupler, wherein the receiver including a comparator having an offset, wherein the receiver producing a receiver output with a positive offset, the output being denoted as an up signal, wherein the receiver producing a receiver output with a negative offset, the output being denoted as a down signal; and a demodulator for receiving the up and down signals, wherein the demodulator outputting, in response to receiving an up signal when circuit data thereof is in a logically high state, an error indication signal indicating that the data includes an error, and wherein the demodulator outputting, in response to receiving a down signal when circuit data thereof is in a logically low state, an error indication signal indicating that the data includes an error.

* * * * *